United States Patent
Yu et al.

(10) Patent No.: US 10,529,924 B2
(45) Date of Patent: Jan. 7, 2020

(54) SUPPORT AND DETACHMENT OF FLEXIBLE SUBSTRATES

(71) Applicant: ROYOLE CORPORATION, Fremont, CA (US)

(72) Inventors: Xiaojun Yu, Fremont, CA (US); Peng Wei, Fremont, CA (US); Ze Yuan, Fremont, CA (US); Zihong Liu, Fremont, CA (US)

(73) Assignee: SHENZHEN ROYOLE TECHNOLOGIES CO. LTD., Shenzhen, Guangdong (CN)

( * ) Notice: Subject to any disclaimer, the term of this patent is extended or adjusted under 35 U.S.C. 154(b) by 0 days.

(21) Appl. No.: 15/566,163

(22) PCT Filed: Apr. 13, 2016

(86) PCT No.: PCT/US2016/027346
§ 371 (c)(1),
(2) Date: Oct. 12, 2017

(87) PCT Pub. No.: WO2016/168341
PCT Pub. Date: Oct. 20, 2016

(65) Prior Publication Data
US 2018/0114905 A1    Apr. 26, 2018

Related U.S. Application Data

(60) Provisional application No. 62/146,411, filed on Apr. 13, 2015, provisional application No. 62/146,408, (Continued)

(51) Int. Cl.
*H01L 51/00* (2006.01)
*H01L 21/683* (2006.01)

(52) U.S. Cl.
CPC ........ *H01L 51/003* (2013.01); *H01L 21/6836* (2013.01); *H01L 51/0097* (2013.01); *H01L 2227/326* (2013.01)

(58) Field of Classification Search
CPC ............... H01L 51/003; H01L 51/0097; H01L 2227/326; H01L 21/6836; H01L 2924/078;
(Continued)

(56) References Cited

U.S. PATENT DOCUMENTS 7,397,129 B2 * 7/2008 Lee ..................... G06F 1/183
257/737
8,598,695 B2 * 12/2013 Oganesian ............ H01L 23/481
257/686

(Continued)

FOREIGN PATENT DOCUMENTS

EP          2717307 A1     4/2014
JP       2013-010342 A     1/2013

(Continued)

OTHER PUBLICATIONS

Royole Corporation, International Search Report and Written Opinion, PCT/US2016/027346, dated Aug. 31, 2016, 21 pgs.

(Continued)

*Primary Examiner* — Zandra V Smith
*Assistant Examiner* — Abbigale A Boyle
(74) *Attorney, Agent, or Firm* — Morgan, Lewis & Bockius LLP

(57) ABSTRACT

This application discloses a flexible substrate device that includes a flexible substrate and a plurality of electronic devices. The flexible substrate includes a top surface and a bottom surface opposite to the top surface, and the plurality of electronic devices formed on the top surface of the flexible substrate. The bottom surface further includes one or (Continued)

more strong adhesion regions and one or more normal adhesion regions that are distinct from the one or more strong adhesion regions. Each of the one or more strong adhesion regions and the one or more normal adhesion regions are configured to attach to a rigid carrier with first adhesion strength and second adhesion strength, respectively. The first adhesion strength is substantially larger than the second adhesion strength. In some embodiments, the flexible substrate device is a thin film transistor (TFT) device, and the plurality of electronic devices includes a TFT array.

20 Claims, 19 Drawing Sheets

Related U.S. Application Data filed on Apr. 13, 2015, provisional application No. 62/146,418, filed on Apr. 13, 2015.

(58) Field of Classification Search
CPC ... H01L 2221/68386; H01L 2221/6839; H01L 2221/68395
See application file for complete search history.

(56) References Cited

U.S. PATENT DOCUMENTS

| | | | |
|---|---|---|---|
| 2003/0032210 A1 | 2/2003 | Takayama et al. | |
| 2010/0167031 A1 | 7/2010 | Leu et al. | |
| 2011/0186998 A1* | 8/2011 | Wu | H01L 21/486 257/738 |
| 2012/0201961 A1 | 8/2012 | Liao et al. | |
| 2012/0235315 A1 | 9/2012 | Wu et al. | |
| 2012/0288685 A1 | 11/2012 | Yukawa et al. | |
| 2014/0240985 A1 | 8/2014 | Kim et al. | |
| 2014/0242318 A1 | 8/2014 | Su et al. | |
| 2015/0060870 A1 | 3/2015 | Ro et al. | |
| 2015/0123106 A1* | 5/2015 | Yasumoto | B32B 43/006 257/40 |
| 2015/0231858 A1* | 8/2015 | van Neer | B32B 7/12 428/201 |
| 2015/0380680 A1* | 12/2015 | Sakuishi | H01L 51/56 257/99 |
| 2016/0329268 A1* | 11/2016 | Howard | H01L 21/6835 |

FOREIGN PATENT DOCUMENTS

| | | |
|---|---|---|
| JP | 2013-026546 A | 2/2013 |
| JP | 2013-073001 A | 4/2013 |
| JP | 2013-254732 A | 12/2013 |
| KR | 20140137950 A | 12/2014 |
| WO | WO2012164882 A1 | 12/2012 |
| WO | WO 2014054949 A1 | 4/2014 |
| WO | WO 2015/000095 A1 | 1/2015 |
| WO | WO 2015012339 A1 | 1/2015 |

OTHER PUBLICATIONS

Royole Corporation, Partial European Search Report, EP16780660.3, dated Nov. 29, 2018, 18 pgs.
Royole Corporation Extended European Search Report, EP16780660.3, dated Mar. 6, 2019, 15 pgs.
Royole Corporation, Notice of Reasons for Rejection, JP2017553327, dated Jan. 25, 2019, 17 pgs.
Royole Corporation, Notice of Preliminary Rejection, KR10-2017-7032490, dated Dec. 10, 2018, 15 pgs.
Royole Corporation, Extended European Search Report, EP19154236.4, dated Jun. 4, 2019, 10 pgs.
Royole Corporation, Notice of Preliminary Rejection, KR10-2017-7032490, dated Jul. 29, 2019, 36 pgs.

* cited by examiner

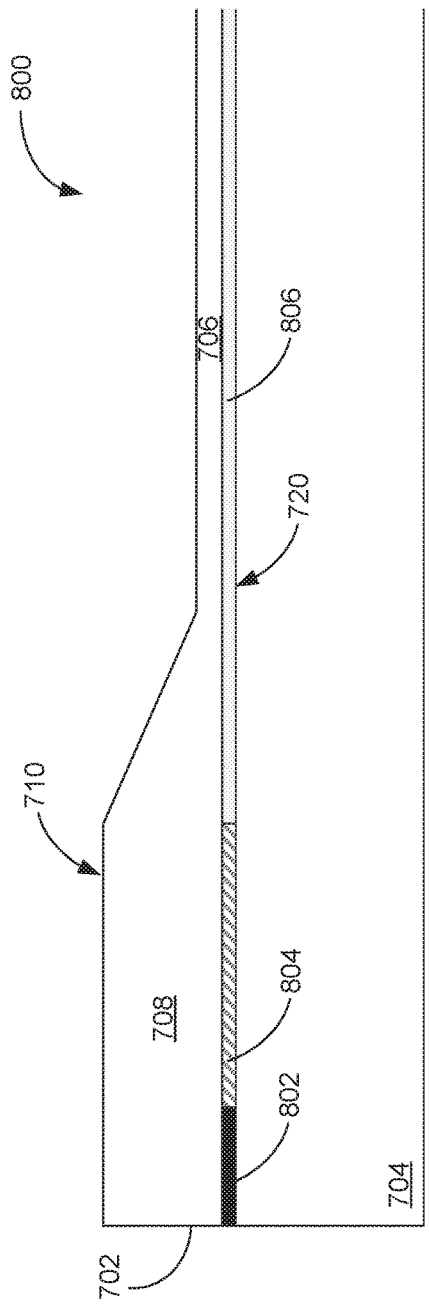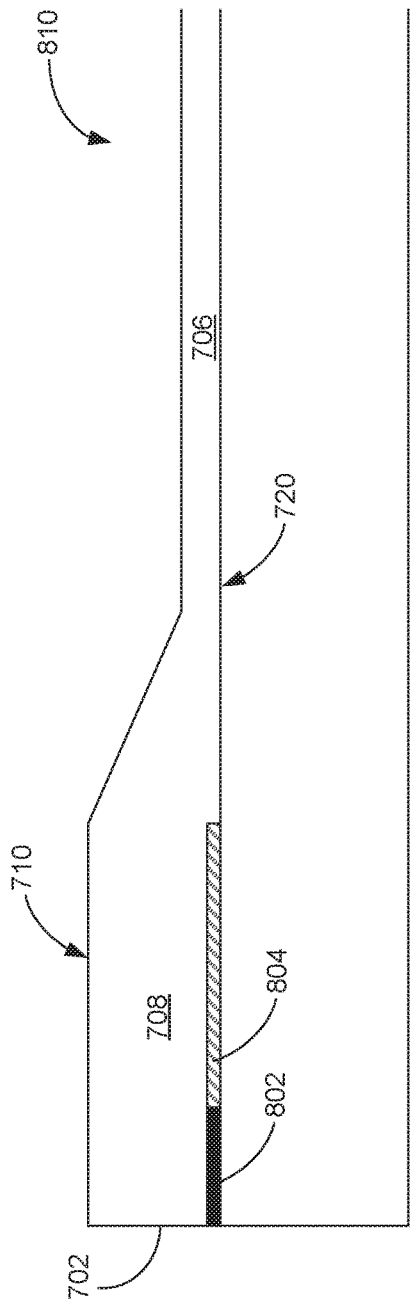

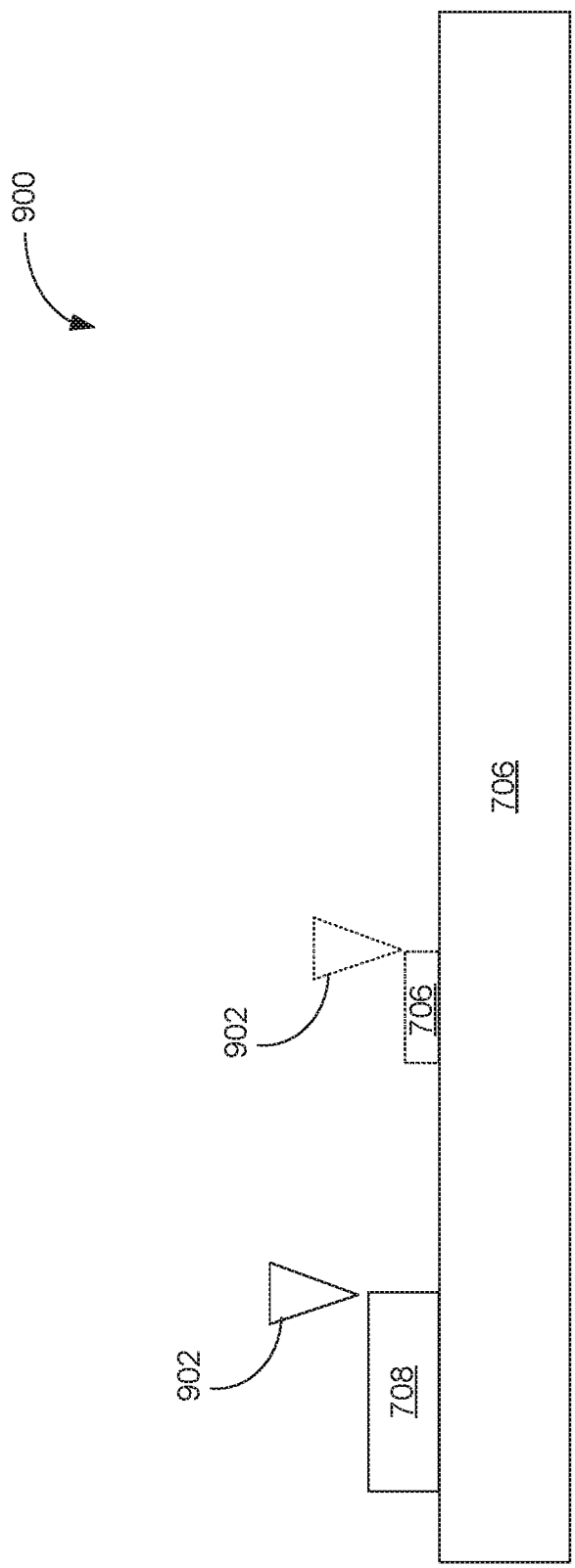

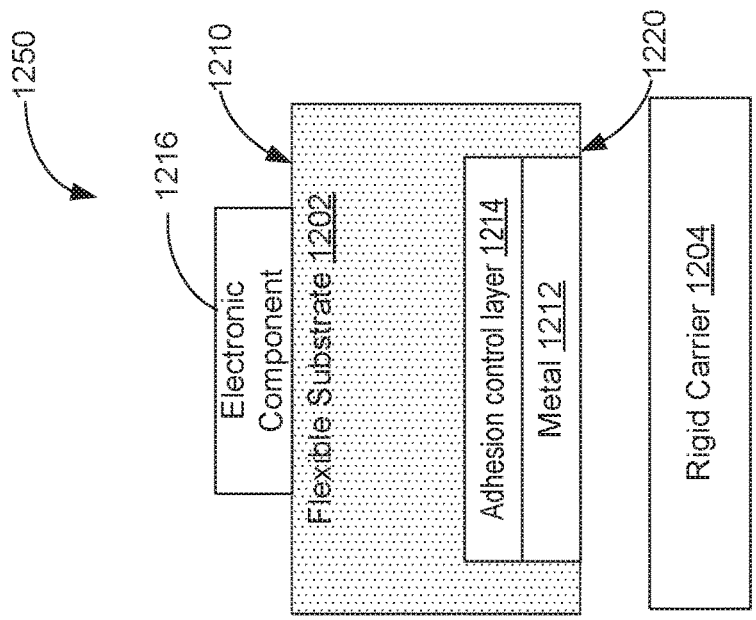
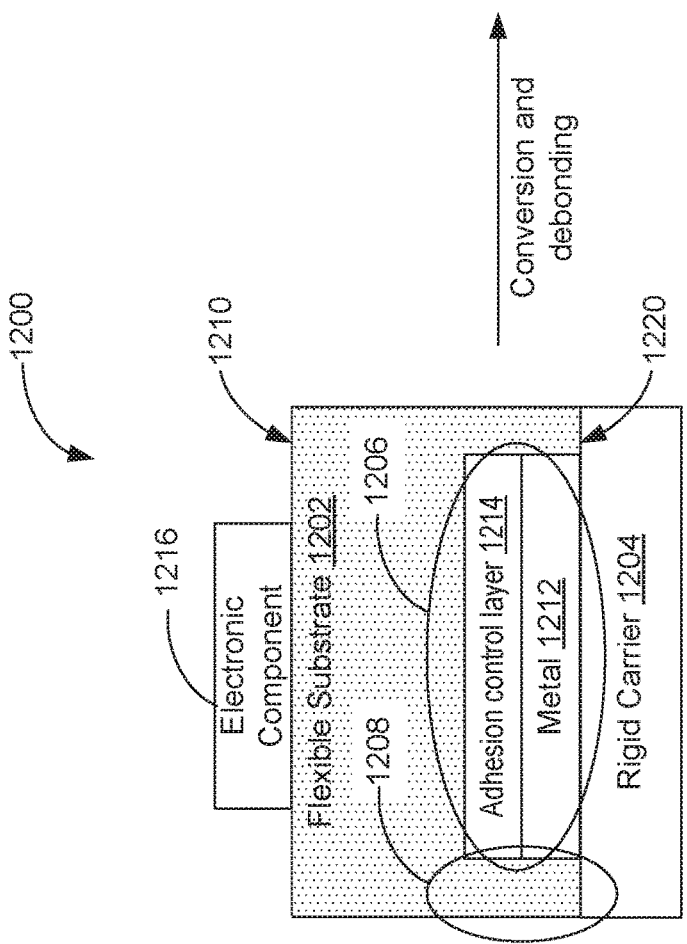
FIGURE 12B
FIGURE 12A

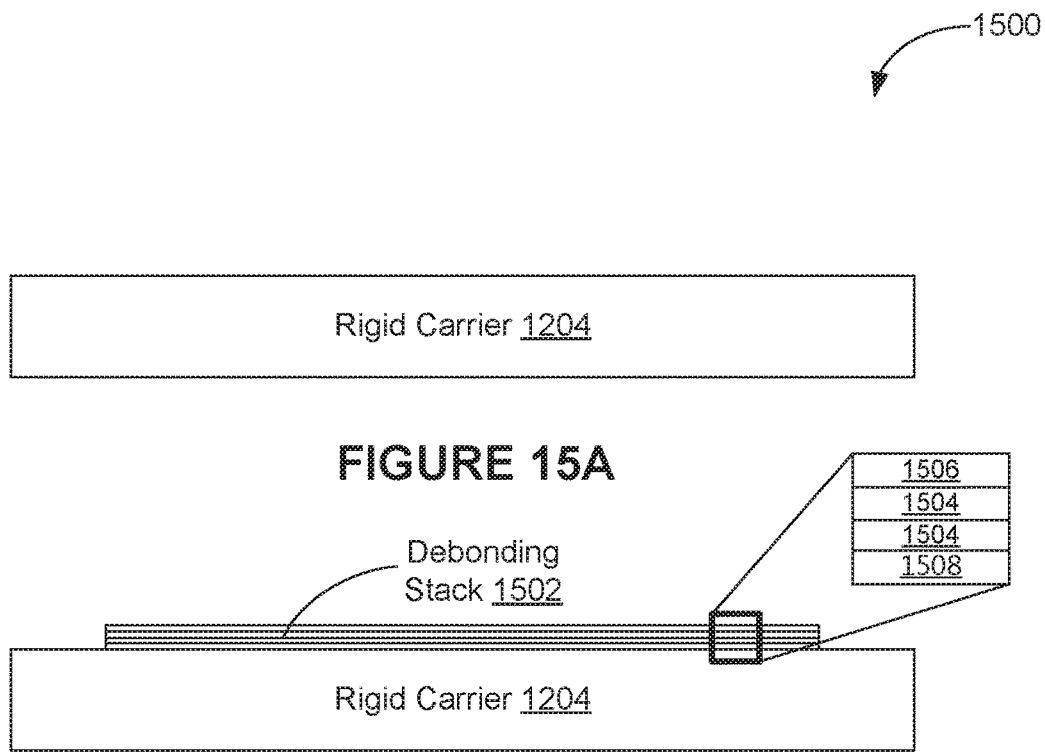
FIGURE 15A
FIGURE 15B
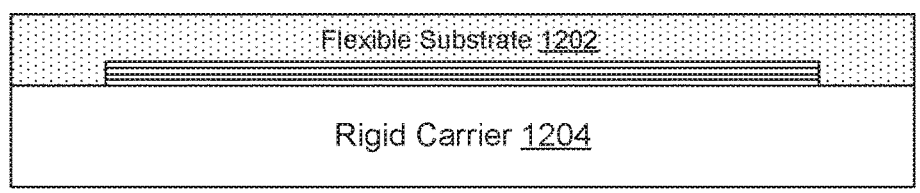
FIGURE 15C

SUPPORT AND DETACHMENT OF FLEXIBLE SUBSTRATES

CROSS REFERENCE TO RELATED APPLICATIONS

This Application is a United States National Stage Application filed under 35 U.S.C. § 371 of PCT Patent Application Serial No. PCT/US2016/027346 filed on Apr. 13, 2016, which claims the benefit of and priority to U.S. Provisional Patent Application No. 62/146,408 filed on Apr. 13, 2015, U.S. Provisional Patent Application No. 62/146,411 filed on Apr. 13, 2015, and U.S. Provisional Patent Application No. 62/146,418 filed on Apr. 13, 2015, which are hereby incorporated by reference in their entireties.

TECHNICAL FIELD

This application relates generally to flexible substrates of electronic devices, and more specifically, to flexible substrate structures and manufacturing methods that enable easy detachment of flexible substrates from rigid carriers after the electronic devices has been manufactured on the flexible substrates with the support of the rigid carriers.

BACKGROUND

Thin and flexible electronic displays are of great interest for application in wearable devices, electronic newspapers, smart identity cards and many other consumer electronics. Such flexible electronic displays have been realized in active matrix organic light emitting diode (AMOLED) displays. Specifically, in the AMOLED displays, thin film transistor (TFT) devices are made on flexible substrates by depositing thin films of an active semiconductor layer in conjunction with dielectric insulation layers and metallic contacts. The flexible substrates are temporarily attached to rigid carriers that provide sufficient mechanical support to the flexible substrates during the course of preparing the TFT devices and the corresponding AMOLED displays. After the TFT devices and the corresponding AMOLED displays are formed on the flexible substrates, the flexible substrates have to be detached from the rigid carriers without causing damages to the TFT devices or display elements of the AMOLED displays formed thereon.

An excimer laser has often been applied to release a flexible substrate from a rigid carrier. The excimer laser has been used to treat an interface between the flexible substrate and the rigid carrier when the flexible substrate is formed directly on the rigid carrier, and to treat a sacrificial layer when the flexible substrate is coupled to the rigid carrier via the sacrificial layer. However, the use of the excimer laser is normally associated with a high tool cost, and does not have a high production yield to provide a satisfactory throughput of the flexible substrate.

Alternatively, some prior art manufacturing methods manage to reduce adhesion force between the flexible substrate and the rigid carrier when the flexible substrate is formed on the rigid carrier directly (e.g., use an adhesion control layer between the flexible substrate and the rigid carrier). Due to reduction of the adhesion force, mechanical force can be applied to peel the flexible substrate from the underlying rigid carrier, which therefore involves a significantly less tool cost than the use of the excimer laser. However, there has always been a challenge to control the adhesion force between the flexible substrate and the rigid carrier properly so as to ease the mechanical detachment while still maintaining sufficiently strong attachment of the flexible substrate to the rigid carrier for the purposes of supporting the display manufacturing process.

Therefore, it would be beneficial to have a flexible substrate that can be easily detached from a rigid carrier while not compromising the robustness of the flexible substrate and the quality of display devices formed thereon during a display manufacturing process.

SUMMARY

Accordingly, there is a need for a flexible substrate that is supported by a rigid carrier in a sufficiently robust manner so as to facilitate manufacturing of display devices, while it is still easy to detach the flexible substrate from the rigid carrier without damaging the display devices after the display devices are formed on the flexible substrate. Specifically, in some embodiments, a flexible substrate is attached to a rigid carrier via one or more strong adhesion regions and one or more normal adhesion regions on a bottom surface that comes into contact with the rigid carrier. The strong and normal adhesion regions adhere to the rigid carrier with distinct adhesion strengths, and are detached from the rigid carrier using different detachment methods. In some embodiments, a flexible substrate includes a device region and a device peripheral region located in proximity to the device region. The device peripheral region has a thickness that is substantially larger than a thickness of the device region at least for the purposes of facilitating handling of the flexible substrate. Further, in some embodiments, a flexible substrate is made of a polymeric material, and is attached to a rigid carrier via a debonding region and one or more edge regions. The edge regions are configured to adhere to the rigid carrier via the polymeric material, and the debonding region is configured to adhere to the rigid carrier via at least a debonding layer. As such, the edge regions provide the flexible substrate with strong adhesion to the rigid carrier, while the debonding layer could be engineered to ease detachment of the flexible substrate from the rigid carrier.

In accordance with one aspect of this application, a flexible substrate device includes a flexible substrate and a plurality of electronic devices. The flexible substrate includes a top surface and a bottom surface that is opposite to the top surface, and the plurality of electronic devices formed on the top surface of the flexible substrate. The bottom surface further includes one or more strong adhesion regions and one or more normal adhesion regions that are distinct from the one or more strong adhesion regions. Each of the one or more strong adhesion regions and the one or more normal adhesion regions are configured to attach to a rigid carrier with a first adhesion strength and second adhesion strength, respectively. The first adhesion strength is substantially larger than the second adhesion strength. In some embodiments, the flexible substrate device is a thin film transistor (TFT) device, and the plurality of electronic devices includes a TFT array.

In accordance with another aspect of this application, a method is implemented to form a flexible substrate device. The method includes providing the flexible substrate device supported on a rigid carrier and including a flexible substrate. The flexible substrate further includes a top surface and a bottom surface that are opposite to each other. The plurality of electronic devices is formed on the top surface of the flexible substrate. The bottom surface further includes one or more strong adhesion regions and one or more normal adhesion regions. The method for forming the flexible substrate device further includes detaching the one or more strong adhesion regions from the rigid carrier that is configured to support the flexible substrate device, and after detaching the one or more strong adhesion regions, detaching the one or more normal adhesion regions from the rigid carrier. Each of the one or more strong adhesion regions and the one or more normal adhesion regions is configured to attach to a rigid carrier with a first adhesion strength and second adhesion strength, respectively, and the first adhesion strength is substantially larger than the second adhesion strength.

In accordance with one aspect of this application, a flexible substrate device includes a flexible substrate and a plurality of electronic devices. The flexible substrate further includes a first device region and a device peripheral regions located in proximity to the first device region. The device peripheral region has a first thickness that is substantially larger than a second thickness of the first device region, and is configured to at least facilitate handling of the flexible substrate. The plurality of electronic devices is formed on the first device region of the flexible substrate.

In accordance with one aspect of this application, a method is implemented to form a flexible substrate device. The method includes providing the flexible substrate device supported by a rigid carrier. The flexible substrate device includes a first device region and a device peripheral region located in proximity to the first device region. The device peripheral region has a first thickness that is substantially larger than a second thickness of the first device region and is configured to facilitate handling of the flexible substrate. The method of forming the flexible substrate device further includes detaching the device peripheral region from the rigid carrier that is configured to support the flexible substrate device, and after detaching the device peripheral region, detaching the first device region from the rigid carrier while handling the flexible substrate device at the device peripheral region.

In accordance with one aspect of this application, a flexible substrate device includes a flexible substrate and a plurality of electronic devices. The flexible substrate is made of a polymeric material, and includes a top surface and a bottom surface that is opposite to the top surface. The plurality of electronic devices formed on the top surface of the flexible substrate. The bottom surface of the flexible substrate further includes a debonding region and one or more edge regions. The one or more edge regions are located in proximity to one or more edges of the flexible substrate and configured to adhere to a rigid carrier via the polymeric material. The debonding region is covered with a debonding layer and configured to adhere to the rigid carrier via at least the debonding layer.

In accordance with one aspect of this application, a method is implemented to form a flexible substrate device. The method includes providing the flexible substrate device made of a polymeric material. The flexible substrate includes a top surface and a bottom surface that is opposite to the top. The bottom surface of the flexible substrate further includes a debonding region and one or more edge regions. The one or more edge regions are located in proximity to one or more edges of the flexible substrate and configured to adhere to a rigid carrier via the polymeric material. The debonding region is covered with a debonding layer and configured to adhere to the rigid carrier via at least the debonding layer. The method further includes detaching the one or more edge regions from the rigid carrier that is configured to support the flexible substrate device, and after detaching the one or more edge regions, detaching the debonding region from the rigid carrier, including gradually exposing an interface between the rigid carrier and the debonding region.

In accordance with one aspect of this application, a method is implemented to form a flexible substrate device. The method includes providing a debonding layer on a rigid carrier, and providing a flexible substrate body that is made of a polymeric material and covers the debonding layer. The flexible substrate body extends beyond the debonding layer and adheres to the rigid carrier via the polymeric material at one or more edge regions located in proximity to one or more edges of the flexible substrate body. The method further includes detaching the one or more edge regions from the rigid carrier, and after detaching the one or more edge regions, detaching the debonding layer and the flexible substrate body as a single piece of flexible substrate device from the rigid carrier. When the flexible substrate body is detected from the rigid carrier, an interface between the rigid carrier and the debonding layer is gradually exposed.

BRIEF DESCRIPTION OF THE DRAWINGS

For a better understanding of the various described implementations, reference should be made to the Description of Implementations below, in conjunction with the following drawings in which like reference numerals refer to corresponding parts throughout the figures.

FIGS. 8A and 8B are two enlarged views of and of device peripheral region of flexible substrate in accordance with some implementations.

FIG. 9 illustrates an example process of controlling thickness of flexible substrate corresponding to a first device region and a device peripheral region of flexible substrate in accordance with some implementations.

FIG. 12A is an example flexible substrate device including a flexible substrate that adheres to a rigid carrier via at least a metallic debonding layer, and FIG. 12B is an example flexible substrate device in which its flexible substrate has been detached from rigid carrier in accordance with some implementations.

FIGS. 15A-15F is a process flow of preparing a flexible substrate that adheres to a rigid carrier via one or more debonding layers during the course of manufacturing a TFT array on the flexible substrate in accordance with some implementations.

Like reference numerals refer to corresponding parts throughout the several views of the drawings.

DESCRIPTION OF IMPLEMENTATIONS

In accordance with various implementations of the application, a flexible substrate is configured to adhere to a rigid carrier in a sufficiently robust manner, such that thin film transistor (TFT) devices and corresponding display devices can be manufactured on the flexible substrate while it is supported by the rigid carrier. After the TFT devices and the corresponding display devices are formed, the flexible substrate needs to be released from the rigid carrier without causing any damage to the TFT devices and the corresponding display devices formed thereon. In some embodiments, the flexible substrate is attached to a rigid carrier via one or more strong adhesion regions and one or more normal adhesion regions on a bottom surface of the flexible substrate that comes into contact with the rigid carrier. The strong and normal adhesion regions adhere to the rigid carrier with distinct adhesion strengths, and are detached from the rigid carrier sequentially using different detachment methods. In addition, the flexible substrate could further include a device region and a device peripheral region. The device peripheral region has a thickness that is substantially larger than a thickness of the device region, and is applied to facilitate handling of the flexible substrate. Further, in some embodiments, the flexible substrate is made of a polymeric material, and is attached to a rigid carrier via a debonding region and one or more edge regions. The edge regions are configured to adhere to the rigid carrier via the polymeric material, and the debonding region is configured to adhere to the rigid carrier via at least a debonding layer. As such, the edge regions provide the flexible substrate with strong adhesion to the rigid carrier via the polymeric material, while the debonding layer could be engineered to ease detachment of the flexible substrate from the rigid carrier.

It is noted that a TFT array can be formed on a flexible substrate and act as integrated driver circuit to drive an organic light emitting diode (OLED) array. When the TFT array is assembled with the corresponding OLED array, each individual TFT device of the TFT array is aligned with and disposed in proximity to (e.g., above and adjacent to) a respective OLED display pixel driven by the respective TFT device. Specifically, each individual TFT device of the TFT array is electrically coupled to an OLED of the OLED array, and configured to generate an electrical signal to drive the OLED pixel. In some embodiments, the flexible substrate and the TFT array formed thereon are made of transparent materials, such that light emitted by the OLED or an external light source could provide illumination passing through the TFT array.

Figure 1:
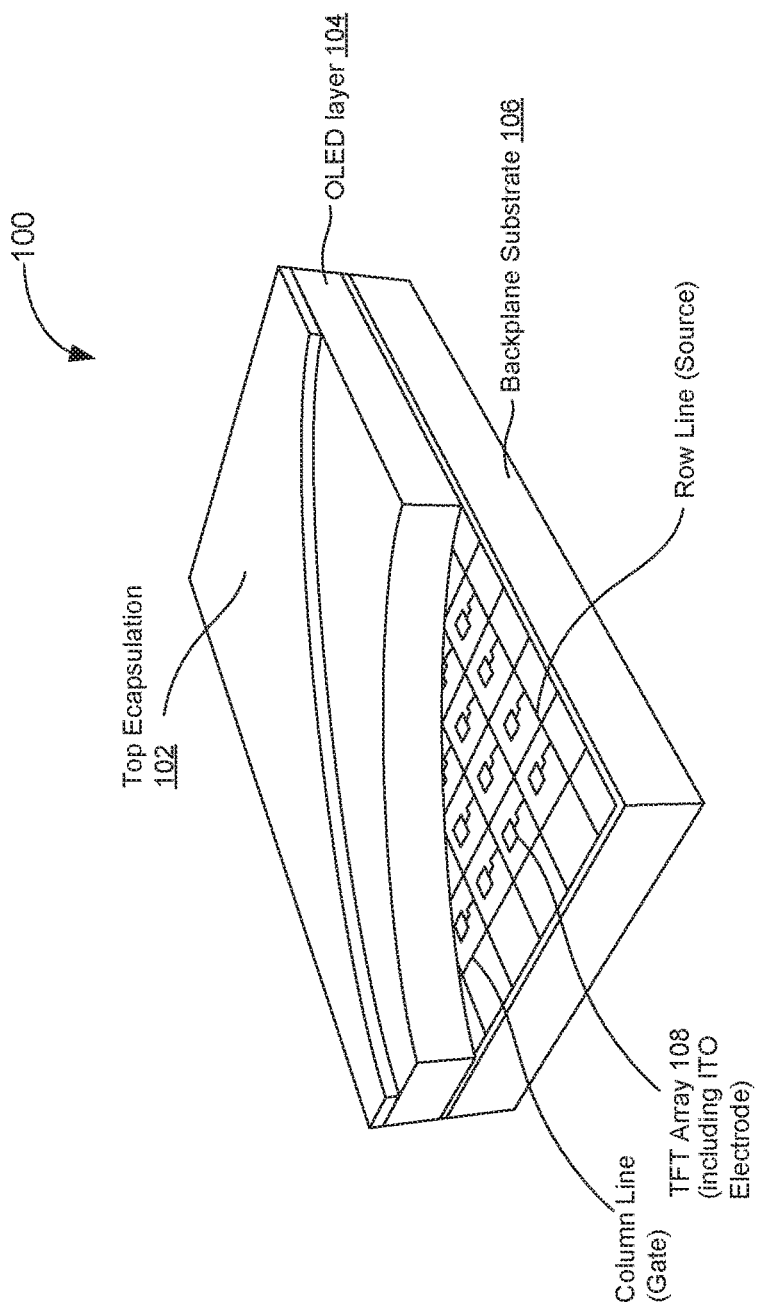
FIG. 1 is an example active matrix organic light emitting diode (AMOLED) display formed based on a flexible substrate in accordance with some implementations of the application.

FIG. 1 is an example active matrix organic light emitting diode (AMOLED) device 100 in accordance with some implementations of the application. AMOLED device 100 is formed based on an organic light emitting diode (OLED) layer 104, and further includes a top encapsulation layer 102 and a backplane substrate 106. AMOLED device 100 includes a two-dimensional (2D) array of OLED pixels that are formed on OLED layer 104 and controlled to emit light individually. Specifically, each OLED pixel includes respective organic compounds on OLED layer 104, and is configured to emit light when one or more TFT devices generate current that flows through the organic compounds corresponding to the respective OLED pixel. The 2D OLED pixel array has been used to create digital displays for electronic devices, including but not limited to televisions, computer monitors, tablet computers, mobile phones, and game consoles. Each AMOLED device 100 represents and is sometimes called a display panel device.

Top encapsulation layer 102 is configured to conceal and protect OLED layer 104. When AMOLED device 100 emits light from its top surface (i.e., via top encapsulation layer 102), top encapsulation layer 102 is made of transparent material. When AMOLED device 100 emits light from its bottom surface (i.e., via backplane substrate 106), top encapsulation layer 102 is optionally made of transparent or non-transparent material. Top encapsulation layer 102 includes a bottom surface that directly contacts OLED layer 104. In some embodiments, the bottom surface of top encapsulation layer 102 is coated with a layer of electrically conductive material that acts as a cathode (also called a common electrode) for the array of OLED pixels formed on OLED layer 104. The common electrode is made of material having a substantially low work function.

A thin film transistor (TFT) array 108 is formed on backplane substrate 106, and directly contacts OLED layer 104. TFT array 108 includes a two dimensional array of TFT drive units, row lines and column lines. Each TFT drive unit is connected to one of the row lines and one of the column lines. Each TFT drive unit of the TFT array 108 is electrically coupled to one or more OLEDs associated with a corresponding OLED pixel, and configured to generate an electrical current to drive the one or more OLEDs of the corresponding OLED pixel. Specifically, in some embodiments, each TFT drive unit includes at least two TFTs with a first TFT to control charging of a storage capacitor, and a second. TFT to couple the corresponding OLEDs to a voltage source at a level needed to create a substantially constant current within the corresponding OLEDs. This substantially constant current flow is controlled at each display pixel to trigger the luminescence (i.e., display at the respective display pixel).

In some embodiments, TFT array 108 is formed on backplane substrate 106. More specifically, a gate layer, a semiconductor layer, a source/drain layer, one or more conductive layers and one or more intervening insulating layers are deposited on backplane substrate 106. These material layers are lithographically patterned on backplane substrate 106 to form functional part (e.g., gate, source and drain) of TFTs of the TFT drive units as well as the row and column lines for accessing the TFT drive units in TFT array 108.

When AMOLED device 100 is rigid, at least one of top encapsulation layer 102 and backplane substrate 106 is made of rigid material (e.g., glass). In various embodiments of the application, AMOLED device 100 includes a flexible lightweight substrate, and is characterized by excellent portability and storage capacity, which increases portability of applications from small-area to large-area displays. Specifically, in a flexible AMOLED device 100, both top encapsulation layer 102 and backplane substrate 106 are made of flexible material (e.g., plastic).

Figure 2A:
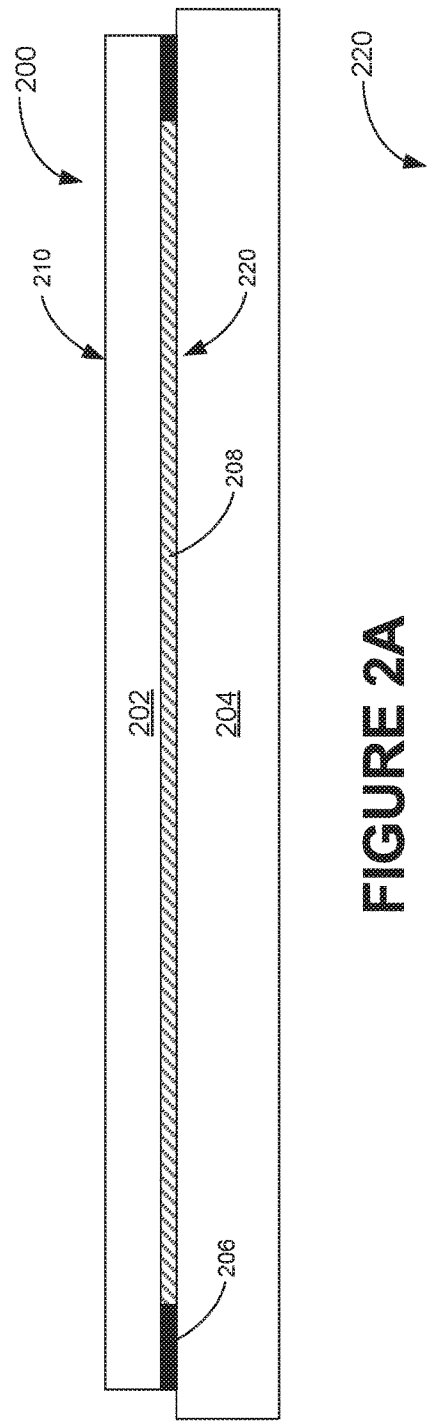
FIGS. 2A and 2B are a cross sectional view and a bottom view of an example flexible substrate that is supported by a rigid carrier during the course of manufacturing TFTs on the flexible substrate in accordance with some implementations, respectively.
Figure 2B:
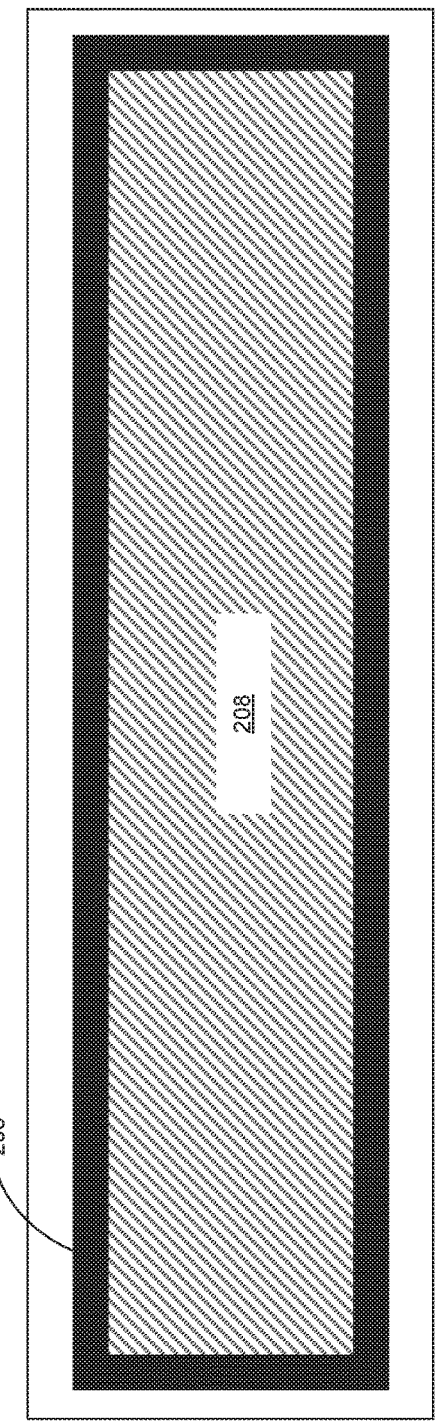

In accordance with various implementations of the application, a TFT array (e.g., a TFT array of an AMOLED device 100) is formed on a flexible substrate, while the flexible substrate is supported by a rigid carrier. The flexible substrate has to adhere to the rigid carrier in a sufficiently robust manner, such that thin film transistor (TFT) devices can be manufactured on the flexible substrate with the support of the rigid carrier. FIGS. 2A and 2B are a cross sectional view 200 and a bottom view 220 of an example flexible substrate 202 that is supported by a rigid carrier 204 during the course of manufacturing TFTs on the flexible substrate 202 in accordance with some implementations, respectively. Flexible substrate 202 could be made of polymeric material, including one or more of poly(methy methacrylate) (PMMA), poly(styrene), poly(vinyl phenol), silsesquioxane (glass resin), benzocyclobutene (BCB), polyimide, polynorbornene, polyamide, polyethersulfone, polyetherimide, polycarbonate, polyethelene naphthalate, polyester, acrylic polymer, nylon, and the like.

Flexible substrate 202 includes a top surface 210 and a bottom surface 220 that is opposite to top surface 210. A plurality of electronic devices is formed on top surface 210 of the flexible substrate. Optionally, the plurality of electronic devices includes one or more TFTs. More specifically, in some embodiments, the plurality of electronic devices includes a plurality of pixel drive circuits formed from the one or more TFTs, and each pixel drive circuit is configured to drive a display pixel of a display device, e.g., an AMOLED device 100. More details on a TFT formed on top surface 210 of flexible substrate 202 are discussed below with reference to FIG. 2C.

Bottom surface 220 of flexible substrate 202 further includes one or more strong adhesion regions 206 and one or more normal adhesion regions 208 that are distinct from the one or more strong adhesion regions 206. Each of the one or more strong adhesion regions 206 and the one or more normal adhesion regions 208 are configured to attach to the rigid carrier with a first adhesion strength and second adhesion strength, respectively. The first adhesion strength is substantially larger than the second adhesion strength. The adhesion strengths of the strong and normal adhesion regions are configured to ease detachment of flexible substrate 202 from the rigid substrate 204, after the plurality of electronic devices are formed on flexible substrate 202 or after one or more AMOLED devices 100 are formed based on the flexible substrate 202.

In some embodiments, the one or more strong adhesion regions 206 and the one or more normal adhesion regions 208 are covered with two distinct materials to provide the first adhesion strength and the second adhesion strength, respectively.

In some embodiments, the one or more normal adhesion regions 208 of flexible substrate 202 are not covered and include the same material as that of flexible substrate 202, i.e., the one or more normal adhesion regions 208 are directly disposed on rigid substrate 204 to obtain the second adhesion strength. The one or more strong adhesion regions 206 are covered with a first adhesion enhancing material that provides the first adhesion strength. For example, the strong adhesion regions could be covered with organic silane compound, hexamethyldisilazane (HMDS), silicon oxide (SiOx), silicon oxynitride (SiOxNy), indium tin oxide (ITO), indium zinc oxide (IZO), indium gallium zinc oxide (IGZO), indium gallium oxide (IGO), or a combination thereof.

Alternatively, in some embodiments, the one or more normal adhesion regions 208 are covered with a second adhesion reducing material to reduce adhesion strength between flexible substrate 202 and rigid carrier 204. Examples of the second adhesion reducing material include, but are not limited to silicon nitride (SiNx), a self assembled layer, an organic silane compound, and a combination thereof. Optionally, the one more strong adhesion regions 206 are covered with another adhesion control material. Optionally, the one more normal strong adhesion regions 206 include the same material as that of flexible substrate 202, i.e., flexible substrate 202 come into contact with rigid carrier 204 directly at the one or more strong adhesion regions 206.

Surface treatment could also be applied on a surface of rigid carrier 204 to enable the one or more strong and normal adhesion regions. Rigid carrier 204 includes one or more first surface areas to which the one or more strong adhesion regions 206 are attached, and one or more second surface areas to which the one or more normal adhesion regions 208 are attached. In some embodiments, the first surface areas of rigid carrier 204 are treated to form attachment with the one or more strong adhesion regions 206 with the first adhesion strength. In some embodiments, the second surface areas of rigid carrier 204 are treated to form attachment with the one or more normal adhesion regions 208 with the second adhesion strength. In some embodiments, both the first and second areas of rigid carrier 204 are treated, but treated differently to enable the first adhesion strength and the second adhesion strength, respectively. Each of the first and second surface areas of rigid carrier 204, if treated, can be treated physically using plasma or laser, or chemically using a surface treatment chemical.

Alternatively, surface treatment could also be applied on selected areas of bottom surface 220 of flexible substrate 202 to create the one or more strong adhesion regions 206 or the one or more normal adhesion regions 208. When respective surface areas of bottom surface 220 corresponding to the strong and normal adhesion regions are treated, they are treated in different manners to enable the first adhesion strength and the second adhesion strength that are distinct from each other. Each of the strong and normal adhesion regions of flexible substrate 202, if treated, can be treated physically using plasma or laser, or chemically using a surface treatment chemical.

In some embodiments, the one or more strong adhesion regions 206 are configured to be detached from rigid carrier 204 via laser ablation. In some embodiments, the one or more normal adhesion regions 208 are configured to be mechanically peeled off rigid carrier 204 after the one or more strong adhesion regions 206 is detached from rigid carrier 204.

Referring to FIGS. 2A and 2B, the one or more strong adhesion regions 206 on bottom surface 220 of flexible substrate 202 include a respective stripe disposed in proximity to each of a plurality of edges of flexible substrate 202. The stripes of the one more strong adhesion regions 206 are connected to form a closed loop that substantially encloses the one or more normal adhesion regions 208. In some embodiments, each of the stripes of the one or more strong adhesion regions 206 have a substantially narrow width (such as 30-500 μm) such that laser having a beam size of the same order could be used to detach the strong adhesion regions.

Flexible substrate 202 may further include a plurality of TFT arrays each of which is configured to drive a display panel device (e.g., an AMOLED device 100). In this specific implementation shown in FIGS. 2A and 2B, flexible substrate 202 includes a single normal adhesion region 206 surrounded by a closed-loop strong adhesion region 206, and this single normal adhesion region 206 lies under the plurality of TFT arrays each of which is associated with an AMOLED display device 100. Flexible substrate 202 could be separated to the plurality of TFT arrays after it is released from rigid carrier 204. It is noted that flexible substrate 202 could also be separated to the plurality of TFT arrays while it is still supported by rigid carrier 204, and that each separated flexible substrate device 202 including one or more respective TFT arrays is released from rigid carrier 204 individually.

Alternatively, in some embodiments, the one or more strong adhesion regions 206 are not disposed in proximity to edges of bottom surface 220. The strong and normal adhesion regions on bottom surface 220 of flexible substrate 202 form an island that is not in proximity to the edges of flexible substrate 202. In a specific example, this island of adhesion regions of flexible substrate 202 could still include a single normal adhesion region 206 surrounded by a closed-loop strong adhesion region 206. Optionally, a TFT array associated with an AMOLED device 100 or a plurality of TFT arrays associated with a plurality of AMOLED devices 100 lie above the single normal adhesion region 208.

Figure 2C:
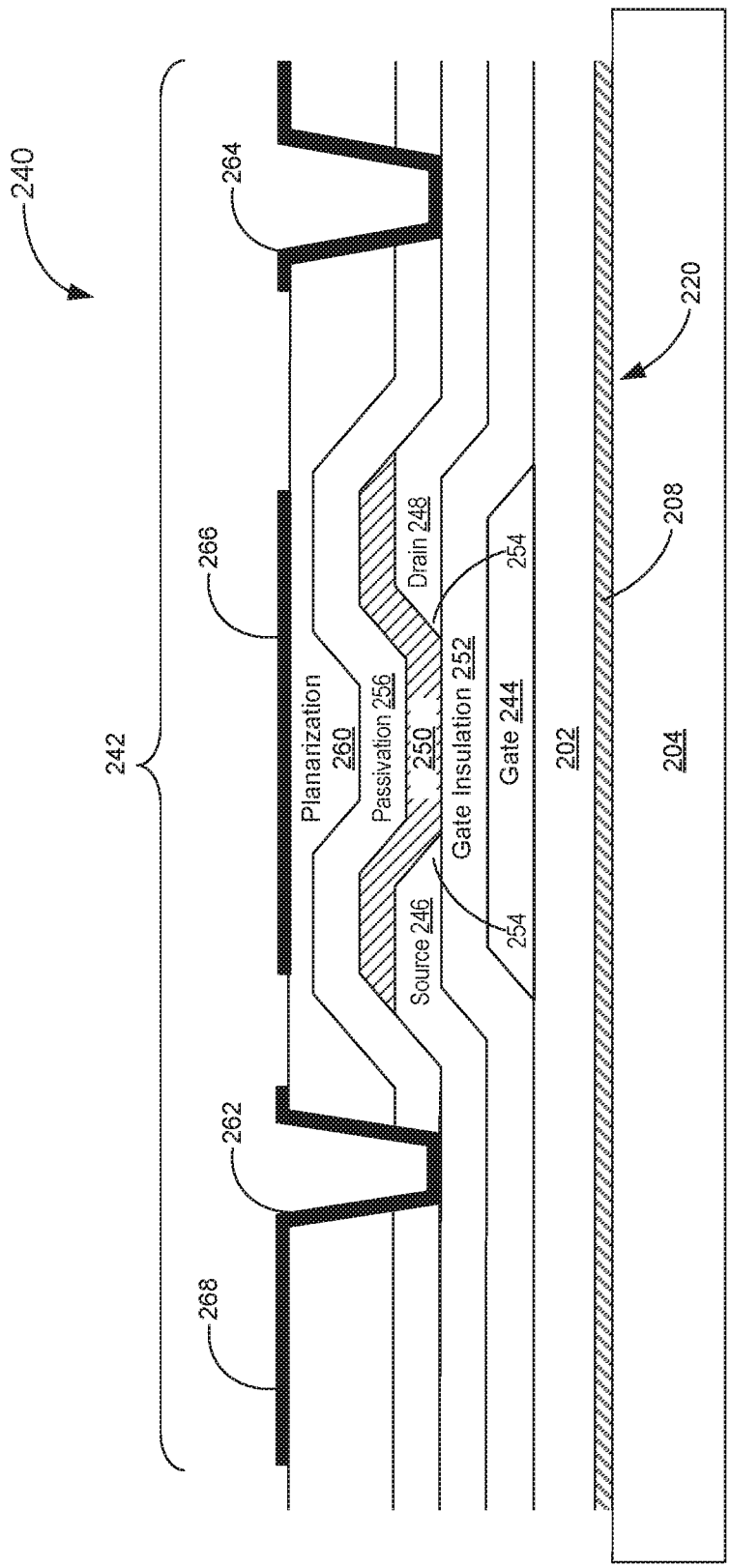
FIG. 2C is a cross sectional view of an example flexible substrate on which one or more TFTs are formed in accordance with some implementations.

FIG. 2C is a cross sectional view 240 of an example flexible substrate 202 on which one or more TFT devices 242 are formed in accordance with some implementations. In addition to the strong and normal adhesion regions on bottom surface 220, flexible substrate 202 further includes one or more TFT devices (e.g., TFT device 242) formed on top surface 210. TFT device 242 is located within one of a TFT array configured to drive an AMOLED device 100, and the TFT array (including TFT device 242) is formed on part of top surface 210 corresponding to the normal adhesion regions 208 of bottom surface 220. TFT device 242 includes at least a gate 244, a source 246, a drain 248 and a channel structure 250. Gate 244 is formed on flexible substrate 202 and protected under a gate insulation layer 252. Source 246 and drain 248 lie above gate insulation layer 252, and are both electrically conductive. Each of source 246 and drain 248 includes a respective first edge 254 that defines a separation gap between source 246 and drain 248, and first edges 254 of source 246 and drain 248 lie above and at least partially overlap gate 244. In some embodiments, source 246 and drain 248 are patterned on a source/drain (S/D) material layer that is electrically conductive, and the separation gap is formed between source 246 and drain 248 after excessive part of the S/D material layer between source 246 and drain 248 is removed.

In some embodiments, TFT device 242 further includes passivation layer 256 that covers at least channel structure 250 for the purposes of protecting channel structure 250. Optionally, passivation layer 256 is made of a polymeric material or a dielectric material (e.g., silicon dioxide, silicon nitride, and a low-k dielectric). Passivation layer 256 can include a single layer of material or multiple layers of distinct materials (e.g. a combination of one or more polymeric material layers and one or more dielectric material layers).

Further, in some embodiments, TFT device 242 could include passivation layer 260 that is disposed on passivation layer 256 and planarized to cover at least channel structure 250. Optionally, planarization layer 260 is substantially thicker than passivation layer 256. Planarization layer 260 can be a single layer or multiple layers of materials. In some embodiments, planarization layer 260 is made of a polymeric material. In some embodiments, planarization layer 260 is made of one or more of other inorganic materials such as metal (e.g., aluminum, molybdenum and titanium), metal oxide (e.g., aluminum oxide, titanium oxide and titanium nitride), dielectric (e.g., silicon dioxide, silicon nitride, and a low-k dielectric), spin on glass (SOG), spin on dielectric (SOD), silicon carbide (SiC), carbon-containing silicon oxide (SiOC), or any combination of two or more of these materials.

In some embodiments, TFT device 242 further includes an electrode layer that is formed on top surface 210 of flexible substrate 202 (i.e., on top of passivation layer 256 or planarization layer 260). The electrode layer is further patterned to, and thus includes a gate electrode (not shown in FIG. 2C), a source electrode 262 and a drain electrode 264 that are electrically coupled to gate 244, source 246 and drain 248, respectively. One or more gate contact openings are defined on passivation layer 256, passivation layer 256 and/or gate insulation layer 252 to allow the gate electrode to access gate 244. Similarly, source or drain contact openings are also defined on passivation layer 256 and passivation layer 256 to allow source electrode 262 or drain electrode 264 to access source 246 or drain 248, respectively.

Further, in some embodiments, the electrode layer disposed on top surface 210 of flexible substrate 202 further includes a top gate 266 formed above top channel 250, and separated from top channel 250 by both passivation layer 256 and planarization layer 260. In some embodiments, top gate 266 and gate 244 are electrically coupled to each other. Alternatively, in some embodiments, the electrode layer formed on top surface 210 of flexible substrate 202 further includes a pixel electrode 268 configured to drive a corresponding display pixel of a display device. The pixel electrode 268 is electrically coupled to the source electrode of TFT device 242 when TFT device 242 is configured to drive a display pixel of an AMOLED device 100.

It is noted that TFT device 242 described herein are exemplary and are not intended to be limiting. For example, any dimensions, materials, manufacturing operations and applications of TFT device 242 described herein are exemplary and are not intended to be limiting. Drawings are not to scale. For brevity, features or characters described in association with some implementations may not necessarily be repeated or reiterated when describing other implementations. Even though it may not be explicitly described therein, a feature or characteristic described in association with some implementations may be used by other implementations.

Figure 3A:
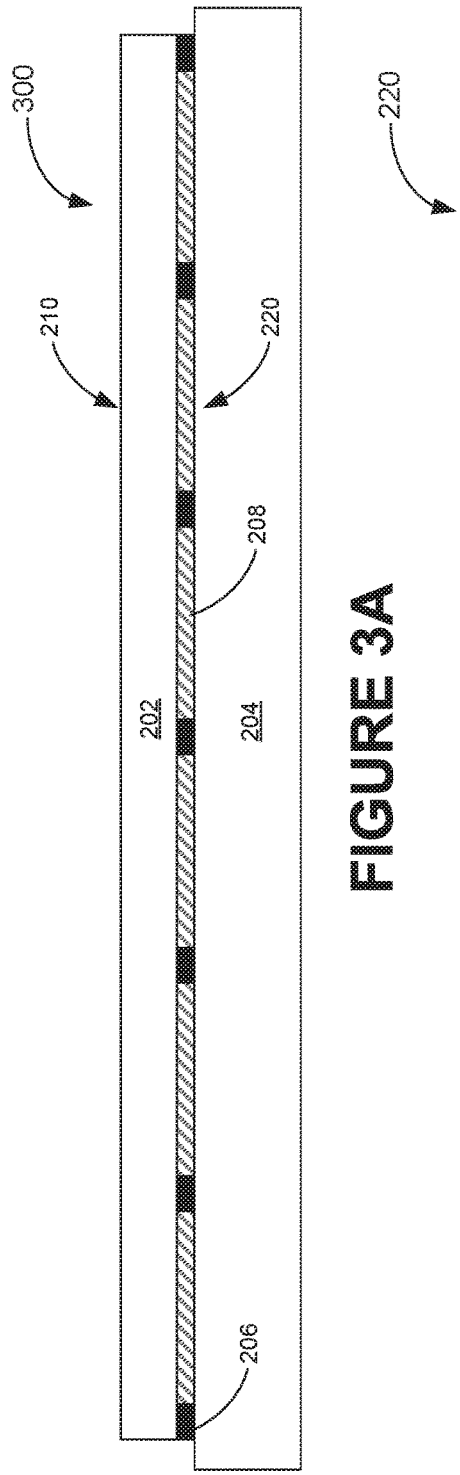
FIGS. 3A and 3B are a cross sectional view and a bottom view of another example flexible substrate supported by a rigid carrier during the course of manufacturing thin film transistors on flexible substrate in accordance with some implementations, respectively in some embodiments
Figure 3B:
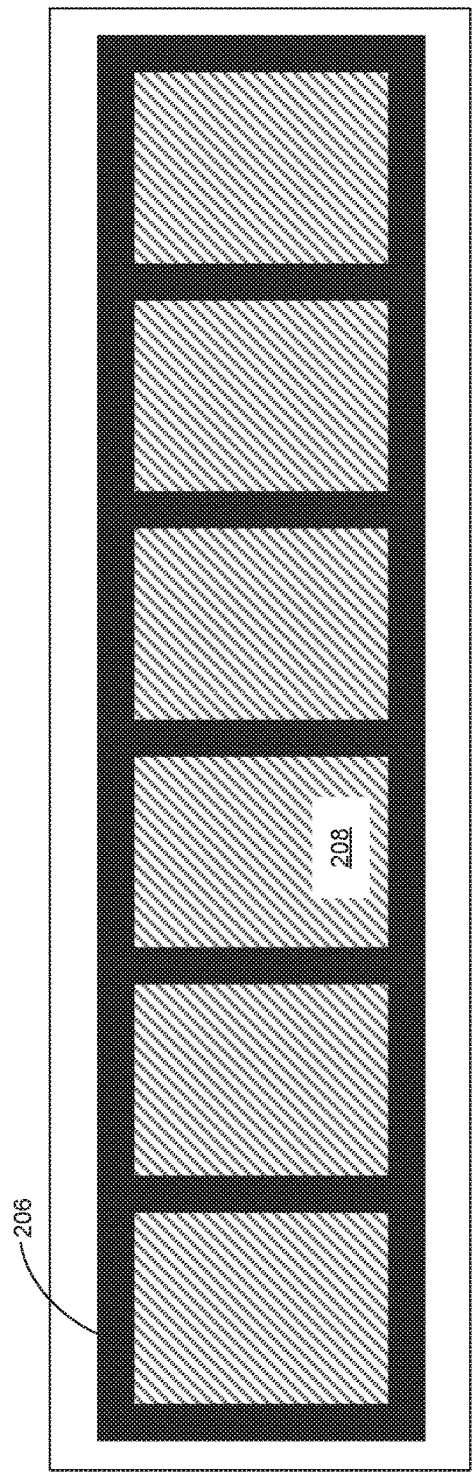

FIGS. 3A and 3B are a cross sectional view 300 and a bottom view 220 of another example flexible substrate 202 supported by a rigid carrier 204 during the course of manufacturing thin film transistors on flexible substrate 202 in accordance with some implementations, respectively. Flexible substrate 202 includes a top surface 210 and a bottom surface 220 that is opposite to top surface 210. A plurality of electronic devices is formed on top surface 210 of flexible substrate 202. Bottom surface 220 of flexible substrate 202 further includes one or more strong adhesion regions 206 and one or more normal adhesion regions 208 that are distinct from the one or more strong adhesion regions 206. Each of the one or more strong adhesion regions 206 is configured to adhere to rigid carrier 204 with a first adhesion strength, and each of the one or more normal adhesion regions 208 is configured to adhere to rigid carrier 204 with a second adhesion strength. The first adhesion strength is substantially larger than the second adhesion strength. The adhesion strengths of the strong and normal adhesion regions are configured to ease detachment of flexible substrate 202 from rigid substrate 204 after the plurality of electronic devices are formed on flexible substrate 202 or after one or more AMOLED devices 100 are formed based on the flexible substrate 202.

In some embodiments, the one or more strong adhesion regions 206 form a grid enclosing the one or more normal adhesion regions 208, such that each of the one or more normal adhesion regions 208 is surrounded by the one or more strong adhesion regions 206. In this specific example as shown in FIG. 3B, bottom surface 220 of flexible substrate 202 includes a plurality of strong adhesion strips that are connected to form the grid of strong adhesion regions 206. A row of six normal adhesion regions 208 are enclosed within the grid of strong adhesion regions 206. Alternatively, the one or more strong adhesion regions 206 form a grid that encloses an array of normal adhesion regions 208 having two or more rows and two or more columns.

In some embodiments, flexible substrate 202 including the grid of strong adhesion regions 206 is applied when the size of flexible substrate 202 is large. The grid of strong adhesion regions 206 is configured to hold flexible substrate 202 tightly at multiple locations, such that flexible substrate 202 can stand extensive thermal cycling during the course of manufacturing the plurality of electronic devices on top surface 210 of flexible substrate 202. For this purpose, the grid of strong adhesion regions 206 has a pitch or spacing that is selected to ensure that flexible substrate 202 is held onto rigid carrier 204 firmly during the manufacturing process. In an example substrate detachment process, strong adhesion regions 206 is released from rigid carrier 204 using excimer laser aberration, and the one or more normal adhesion regions 208 that fill the blocks in the grid of strong adhesion regions 206 are easily peeled off after laser aberration of strong adhesion regions 206.

Figure 4:
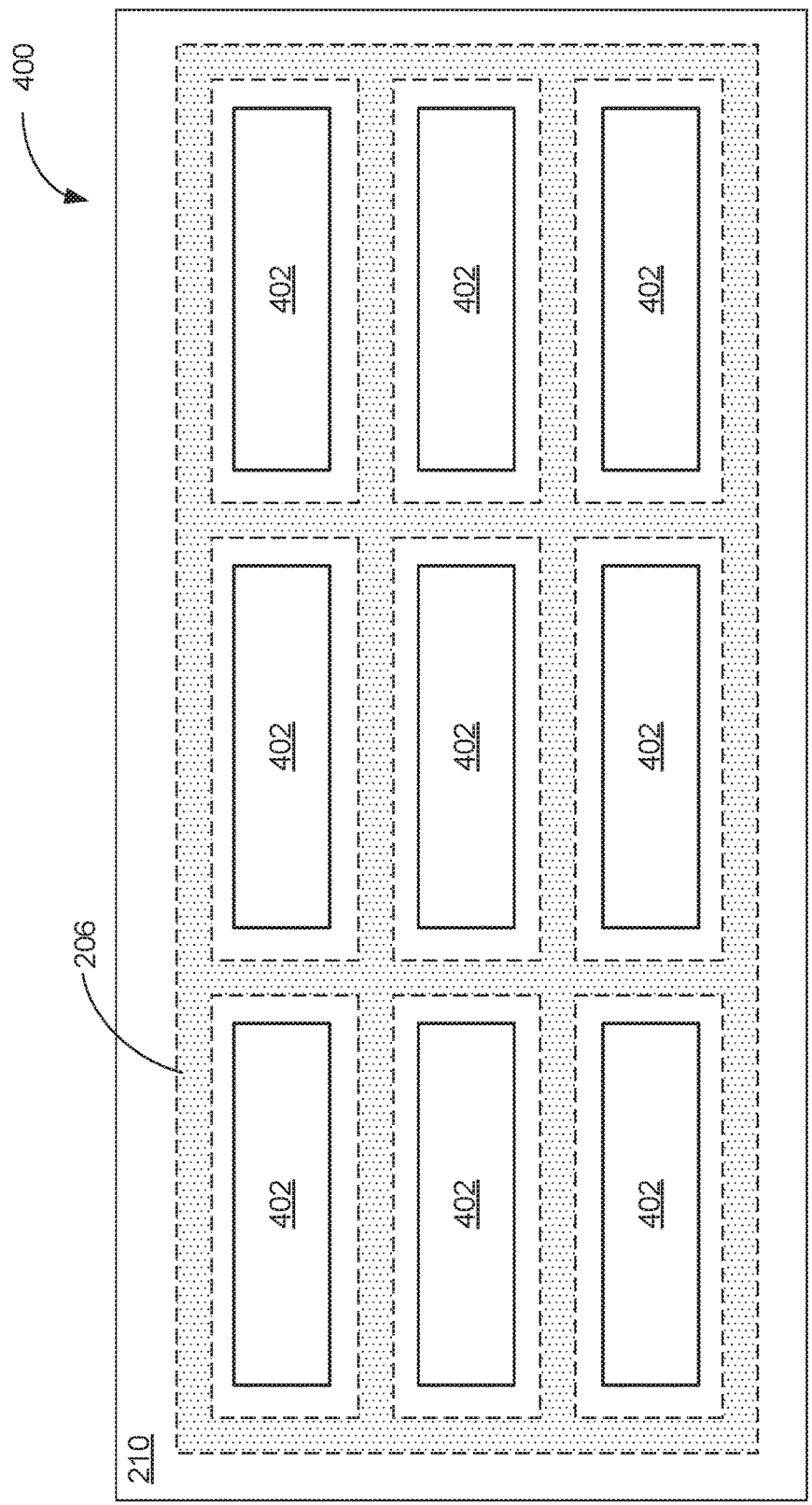
FIG. 4 is a top view of an example flexible substrate on which a plurality of TFT arrays is formed in accordance with some implementations.

FIG. 4 is a top view 400 of an example flexible substrate 202 on which a plurality of TFT arrays is formed in accordance with some implementations. Bottom surface 220 of flexible substrate 202 further includes one or more strong adhesion regions 206 and one or more normal adhesion regions 208. The one or more strong adhesion regions 206 form a grid enclosing the one or more normal adhesion regions 208.

Flexible substrate 202 further includes one or more display panel devices 402 that are disposed on top surface 210 of flexible substrate 202. In some embodiments associated with an AMOLED device 100, flexible substrate 202 acts as the backplane substrate 106, and each display panel device 402 includes top encapsulation layer 102, OLED layer 104 or both. Each display device 402 is electrically coupled to and driven by at least one of the plurality of TFT arrays to form an AMOLED device 100.

Each display panel device 402 is disposed on an area of the top surface 410 corresponding to one of the one or more normal adhesion regions 208 of bottom surface 220 without overlapping the grid of strong adhesion regions 206. In some embodiments, two or more display panel devices 402 lies on an area of top surface 210 corresponding one of the normal adhesion region 208. In some embodiments, only one display panel device 402 lies on an area of top surface 210 corresponding to one of the normal adhesion region 208.

In some embodiments, each of the plurality of TFT arrays formed on the top surface 410 of flexible substrate 402 is electrically coupled to one of the one or more display panel devices 402, and configured to provide electrical signals to drive the respective display panel device 402. As such, in some embodiments, two or more TFT arrays may be formed on an area of top surface 210 corresponding to one of the normal adhesion region 208. In some embodiments, only one TFT array is formed on an area of top surface 210 corresponding to one of the normal adhesion region 208.

Figure 5:
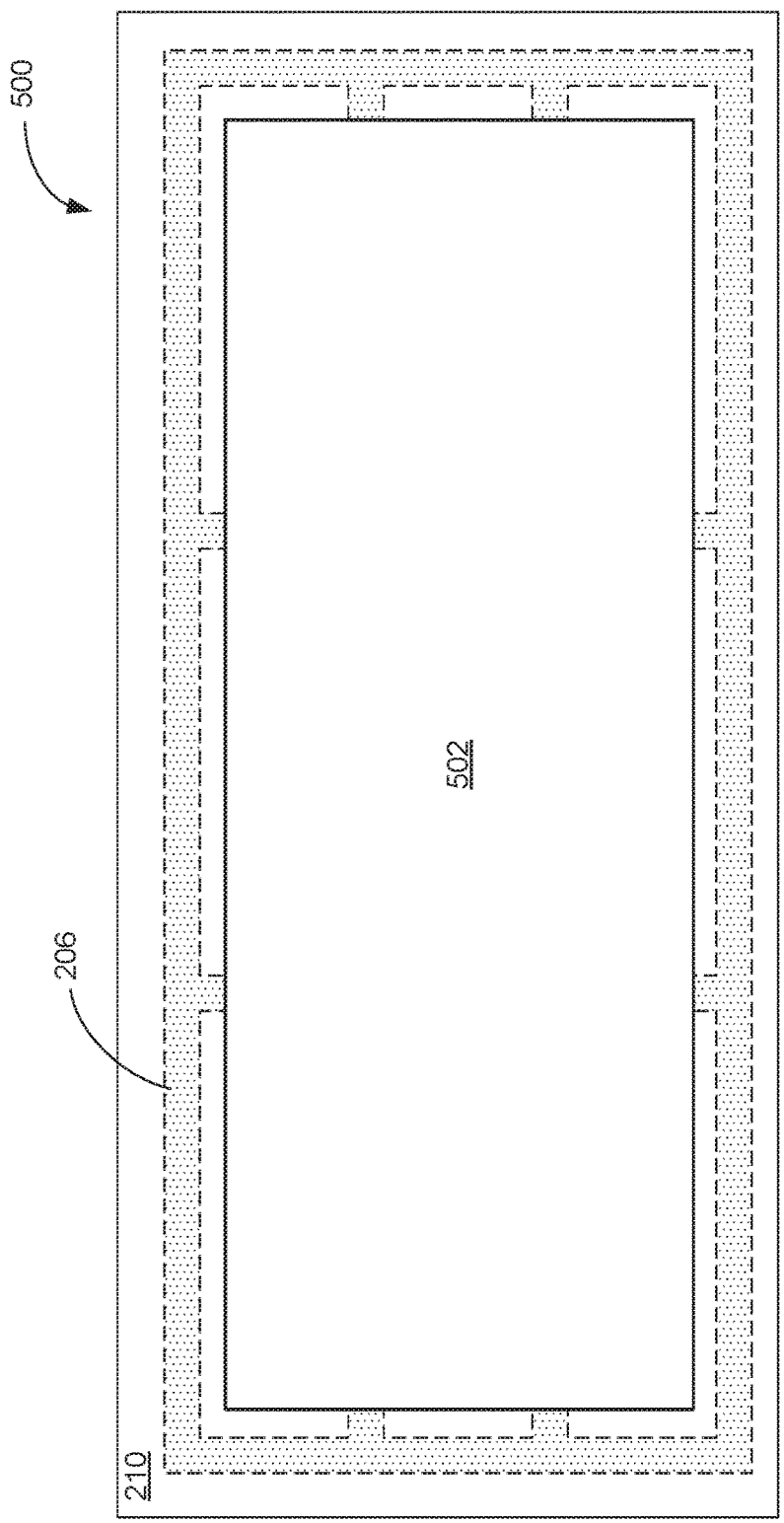
FIG. 5 is a top view of an example flexible substrate on which a TFT array is formed in association with a plurality of normal adhesion regions of the flexible substrate in accordance with some implementations.

FIG. 5 is a top view 500 of an example flexible substrate 202 on which a TFT array is formed in association with a plurality of normal adhesion regions of the flexible substrate in accordance with some implementations. Bottom surface 220 of flexible substrate 202 further includes one or more strong adhesion regions 206 and one or more normal adhesion regions 208. The one or more strong adhesion regions 206 form a grid enclosing the one or more normal adhesion regions 208. Flexible substrate 202 further includes a display panel device 502 that is disposed on top surface 210 of flexible substrate 202. Display panel device 502 is disposed on an area of top surface 210 corresponding to at least two normal adhesion regions 208 of bottom surface 220, and at least partially overlaps the grid of strong adhesion regions 206 that encloses the at least two normal adhesion regions 208. Here, display panel device 502 has a substantially large size, and therefore, two or more normal adhesion regions 208 need to be created to ensure that flexible substrate 202 is firmly held onto rigid carrier 204 during the course of manufacturing the plurality of electronic devices or assembling display panel device 502 onto top surface 210.

In some embodiments, the display panel device 502 is electrically coupled to and driven by one or more TFT arrays that are formed on the top surface 210 of flexible substrate 202. The one or more TFT arrays may be formed on the area of top surface 210 corresponding to the at least two normal adhesion regions 208 and the part of the grid of strong adhesion regions 206 that partially overlaps with display panel device 502 and encloses the at least two normal adhesion regions 208.

Optionally, a laser is applied from the back of rigid carrier 204 to release the one or more strong adhesion regions 206, effectively avoiding to cause any visual defects on display panel device 502. The laser may be configured to detach one or more strong adhesion regions 206 according to a detachment pattern, e.g., starting from an outer edge to an interior region of bottom substrate 220.

Figure 6:
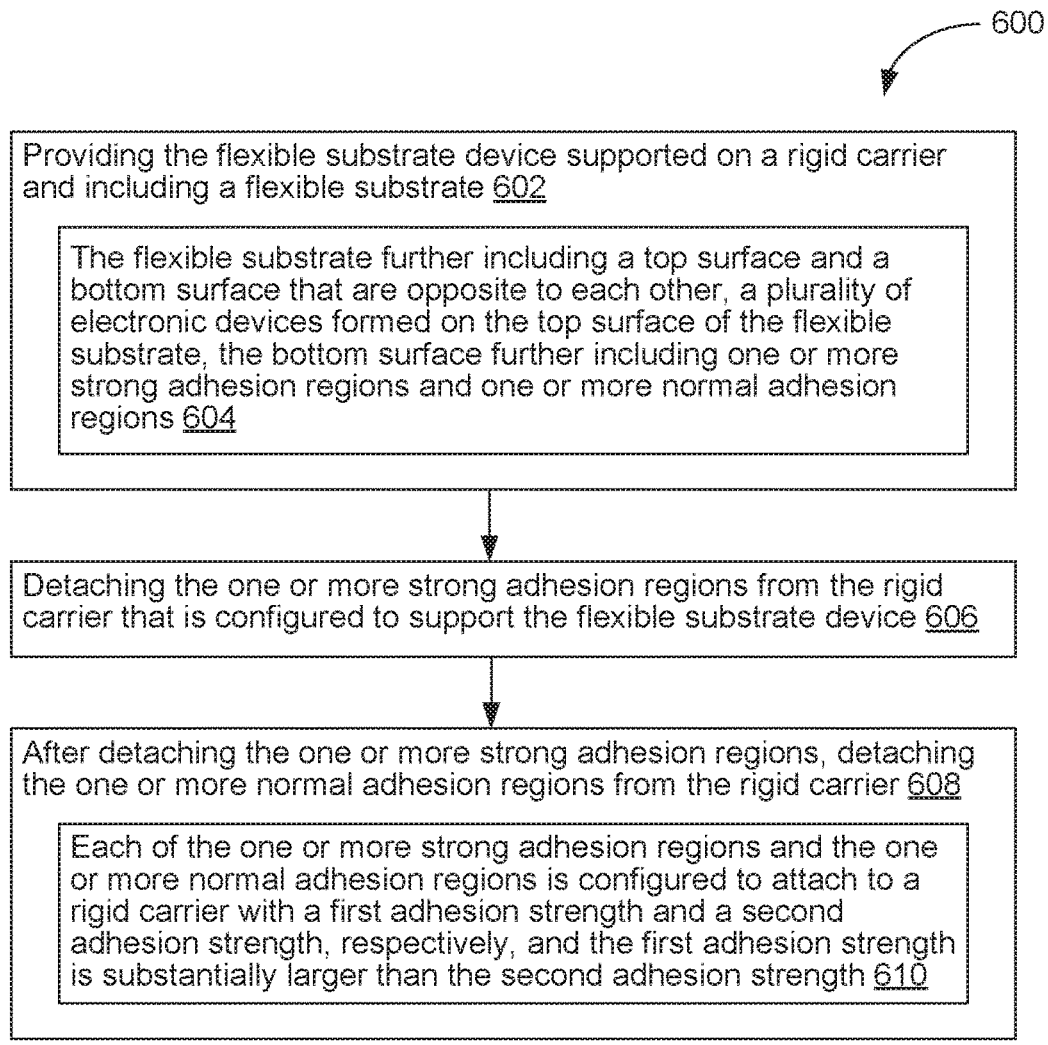
FIG. 6 is a flowchart of an example method of forming a flexible substrate device supported by a rigid carrier during the course of manufacturing thin film transistors on a flexible substrate in accordance with some implementations.

FIG. 6 is a flowchart of an example method 600 of forming a flexible substrate device supported by a rigid carrier (e.g., rigid carrier 204) during the course of manufacturing thin film transistors on a flexible substrate (e.g., flexible substrate 202) in accordance with some implementations. Method 600 provides (602) the flexible substrate device supported on a rigid carrier and including a flexible substrate. The flexible substrate further includes (604) a top surface and a bottom surface that are opposite to each other. A plurality of electronic devices is formed on the top surface of the flexible substrate. The bottom surface further includes one or more strong adhesion regions and one or more normal adhesion regions. As explained above with reference to FIGS. 2A and 2B, a flexible substrate device is provided with support of rigid carrier 204 and includes flexible substrate 202. Flexible substrate 202 includes top surface 210 and bottom surface 220. A plurality of TFT arrays is formed on top surface 210 of flexible substrate 202, and more specifically, TFT devices (e.g., TFT device 242) are formed on top surface 210. In some embodiments, one or more display panel devices (e.g., devices 402 and 502) are disposed on top surface 210 of flexible substrate 202. Bottom surface 220 of flexible substrate 202 includes one or more strong adhesion regions 206 and one or more normal adhesion regions 208.

Each of the one or more strong adhesion regions and the one or more normal adhesion regions is configured to attach to a rigid carrier with a first adhesion strength and second adhesion strength, respectively, and the first adhesion strength is substantially larger than the second adhesion strength. The one or more strong adhesion regions enable strong adhesion of the flexible substrate to the rigid carrier during the course of forming the TFT devices or mounting the display panel devices on the flexible substrate. The one or more normal adhesion regions are relatively easy to be detached from the rigid carrier. As such, integration of the strong and normal adhesion regions on the flexible substrate satisfies a requirement of balancing the adhesion strength for both device manufacturing and substrate detachment.

In accordance with method 600, the one or more strong adhesion regions are detached (606) from the rigid carrier that is configured to support the flexible substrate device. After the one or more strong adhesion regions are detached, the one or more normal adhesion regions are detached (608) from the rigid carrier. In a specific example, the one or more strong adhesion regions are detached from the flexible substrate using a laser aided liftoff, while the one or more normal adhesion regions are mechanically peeled off the flexible substrate. In some embodiments, a first total area of the one or more strong adhesion regions is substantially smaller than a second total area of the one or more normal adhesion regions. Given that a laser is applied only on the strong adhesion regions having a substantially small area, the requirements for the properties of the laser (e.g., beam size, power and efficiency) are not as stringent as when it is used to release a substrate having a much larger area, and the cost of the laser could be significant reduced as well. In addition, this two sequential detachments could be easily integrated, and result in high throughput for the flexible substrate devices for use in display devices.

In some embodiments, a flexible substrate having a thickness of no greater than 20 μm is applied to render a foldable or rollable display. Handling of such an ultra-thin flexible substrate becomes a challenge during the course of releasing it from an underlying rigid carrier (particularly when production equipment is used to automatize the release process). In addition, when an electronic component or a printed circuit board (flexible or rigid) is integrated on the ultra-thin flexible substrate, the flexible substrate may fail to survive an integration process (e.g., ultrasonic bonding). Electrical wires formed to electrically couple the electronic component and the ultra-thin flexible substrate could also be easily damaged and result in electrical open circuit during the release. Due to these issues, the throughput and yield of ultra-thin flexible substrates are significantly compromised.

Figure 7:
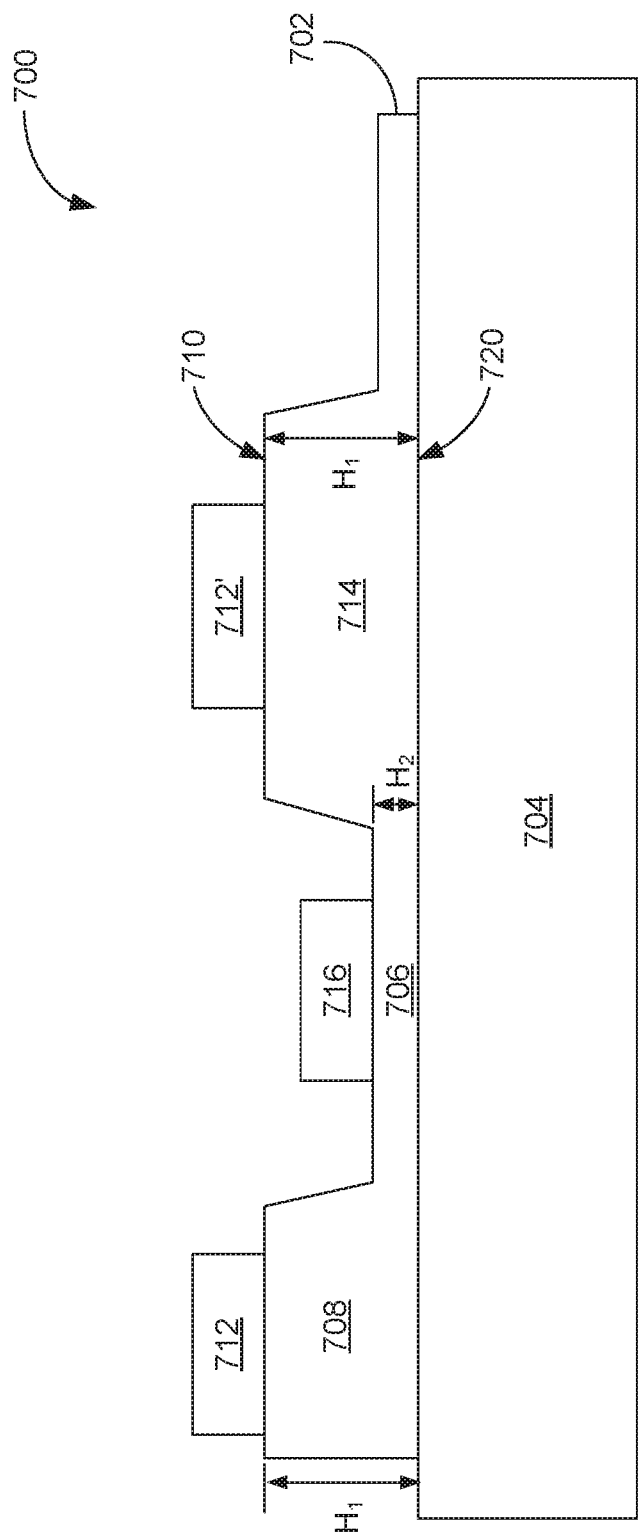
FIG. 7 is a cross sectional view of an example flexible substrate having two or more distinct thicknesses corresponding to a first device region and a device peripheral region in accordance with some implementations.

FIG. 7 is a cross sectional view 700 of an example flexible substrate 702 having two or more distinct thicknesses corresponding to a first device region 706 and a device peripheral region 708 in accordance with some implementations. Flexible substrate 702 is supported by a rigid carrier 704. Device peripheral region 708 is located in proximity to first device region 706. A plurality of electronic devices (not shown in FIG. 7) is formed on first device region 706 of flexible substrate 702. Further, device peripheral region 708 has a first thickness $H_1$ that is substantially larger than a second thickness $H_2$ of the first device region 706 for the purposes of facilitating handling of flexible substrate 702 during the release of flexible substrate 702 from rigid substrate 704. In some embodiments, the first thickness $H_1$ of device peripheral region 708 is within a range of 10-200 μm. In some embodiments, the second thickness $H_2$ of first device region 706 is within a range of 5-30 μm.

In some embodiments, device peripheral region 708 is configured to support an electronic circuit component 712 disposed on device peripheral region 708. In some embodiments, flexible substrate 702 further includes a second device region 714 having a thickness that is substantially equal to the first thickness $H_1$ of device peripheral region 708, and second device region 714 is configured to support an electronic circuit component 712' disposed thereon. The thickness $H_1$ of device peripheral regions 708 and second device region 714 increases mechanical robustness of flexible substrate 702, and are configured to avoid damage to flexible substrate 702 while and after electronic circuit component 712 or 712' is bonded on flexible substrate 702. Optionally, the electronic circuit component disposed on the device peripheral region 708 or second device region 712' includes at least part of TFT array interface circuit that is coupled to and configured to control the TFT array formed on top surface 710 of flexible substrate 702.

Alternatively, in some embodiments, device peripheral region 708 is configured to support electronic bonding to one or more electronic pads or leads that are formed and exposed on top surface 710 of flexible substrate 702. The electronic bonding allows electrical signals to be transferred into and out of a TFT array that is formed on first device region 706 of flexible substrate 702.

It is noted that device peripheral region 708 having the first thickness is located in proximity to a respective edge of flexible substrate 702. As to its location with respect to rigid carrier 704, device peripheral region 708 is optionally located in proximity to a respective edge of rigid carrier 704 or substantially away from any edge of rigid carrier 704. On the other hand, second device region 714 having the first thickness is formed as an island substantially away from any edge of flexible substrate 702 or rigid carrier 704. In a specific example, rigid carrier 704 is configured to support a plurality of flexible substrates 702 that are formed from a single substrate layer and separated into distinct flexible substrates 702 prior to their release from rigid carrier 704. Each of the plurality of flexible substrates 702 needs to be detached from rigid carrier 704 individually. When a respective flexible substrate 702 includes a device peripheral region 708 in proximity to an edge of the flexible substrate 702, one or more electronic circuit components 712 can be securely supported at device peripheral region 708 having a substantially large thickness. More importantly, due to its substantially large thickness, flexible substrate 702 itself can be safely and conveniently handled at device peripheral region 708 without causing damage to first device region 706 during and after the release of flexible substrate 702 from rigid carrier 704.

In some embodiments, a TFT array (e.g., a TFT array of an AMOLED device 100) is formed on first device region 706 of the flexible substrate 702. A display panel device 716 could be disposed on top of the TFT array formed on first device region 706. In some embodiments associated with an AMOLED device 100, flexible substrate 702 acts as the backplane substrate 106, and each display panel device 716 includes top encapsulation layer 102, OLED layer 104 or both. The TFT array is electrically coupled to, and configured to generate electrical signals to drive display panel device 716.

FIGS. 8A and 8B are two enlarged views of 800 and 810 of device peripheral region 706 of flexible substrate 702 in accordance with some implementations. Flexible substrate 702 includes a top surface 710 and a bottom surface 720. Bottom surface 720 corresponding to device peripheral region 708 includes one or both of a strong adhesion region 802 and a weak adhesion region 804 configured to adhere to rigid carrier 704 with first adhesion strength and second adhesion strength, respectively. The first adhesion strength is substantially larger than the second adhesion strength. When device peripheral region 708 includes both of the strong and weak adhesion regions, strong adhesion region 802 is arranged in proximity to an edge of flexible substrate 702, while weak adhesion region 804 could be disposed in proximity to strong adhesion region 802 and remain substantially close to the edge of flexible substrate. Optionally, weak adhesion region 804 is covered with a debonding layer or treated on its surface to provide the second adhesion strength. The debonding layer could be made of silicon nitride (SiNx), self assembled layer organic silane compound, or a combination thereof. In some implementations, the debonding layer have a thickness in the range of 1~400 nm.

Optionally, bottom surface 720 corresponding to first device region 706 further includes a normal adhesion region 806 and is configured to adhere to rigid carrier 704 with third adhesion strength. The third adhesion strength is substantially larger than the second adhesion strength and smaller than the first adhesion strength. Referring to FIG. 8A, in some embodiments, first device region 706 is configured to adhere to rigid carrier 704 via an adhesion control layer that provides the third adhesion strength. Alternatively, referring to FIG. 8B, in some embodiments, first device region 706 is configured to adhere to rigid carrier 704 directly without using an adhesion control layer. Optionally, bottom surface 720 corresponding to first device region 706 or an area of rigid carrier 704 to which first device region 706 adheres is treated physically or chemically (e.g., with a laser or plasma) before flexible substrate 702 adheres to rigid carrier 704.

In some embodiments, strong adhesion region 802 is configured to be detached from the rigid carrier using laser ablation, and weak adhesion region 804 is configured to be detached from rigid carrier 704 by being mechanically peeled off rigid carrier 704. After detachment of strong adhesion region 802, weak adhesion region 804 can be detached from rigid carrier 704 conveniently due to the second adhesion force that is rendered substantially weak. Subsequent to detachment of weak adhesion region 804, first device region 706 continues to be peeled off rigid carrier 704 until flexible substrate 702 is entirely released off rigid carrier 704. During the release of flexible substrate 702, a user could handle flexible substrate 702 at device peripheral region 708 without causing damage to the plurality of electronic devices formed on first device region 706.

FIG. 9 illustrates an example process 900 of controlling thickness of flexible substrate 702 corresponding to a first device region 706 and a device peripheral region 708 of flexible substrate 702 in accordance with some implementations. Example methods of controlling thickness of flexible substrate 702 include, but are not limited to, slot-die coating and slit coating. For example, a material distribution chamber is filled with a substrate material, and the substrate material is injected onto flexible substrate 702 via a feed slot 902. A first area of rigid carrier 704 corresponding to device peripheral region 708 or second device region 714 is injected and coated with a first thickness $H_1$ of the substrate material, and a second area of rigid carrier 706 corresponding to first device region 706 is injected and coated with a second thickness $H_2$ of the substrate material.

Alternatively, in some embodiments not shown in FIG. 9, the first area of rigid carrier 704 corresponding to device peripheral regions 708 or second device region 714 are selectively covered with the substrate material used to form flexible substrate 702. The entire substrate of rigid carrier 704 is then coated with the substrate material globally, and the global coating is substantially consistent with the second thickness $H_2$ of first device region 706. The first area of rigid carrier 704 is coated twice with the substrate material, resulting in the first thickness $H_1$ which is substantially larger than the second thickness $H_2$.

Figure 10A:
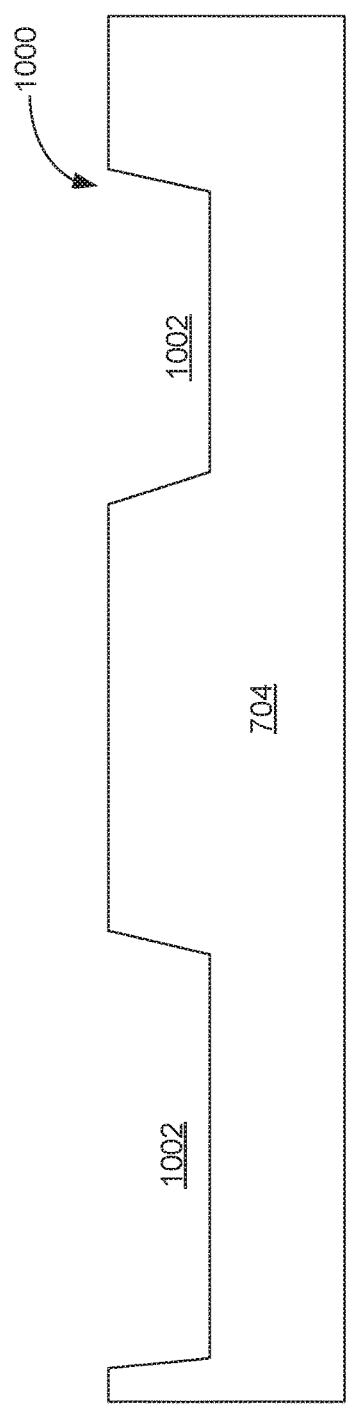
FIGS. 10A and 10B illustrate an example process of controlling thicknesses of flexible substrate corresponding to a first device region and a device peripheral region of the flexible substrate in accordance with some implementations.
Figure 10B:
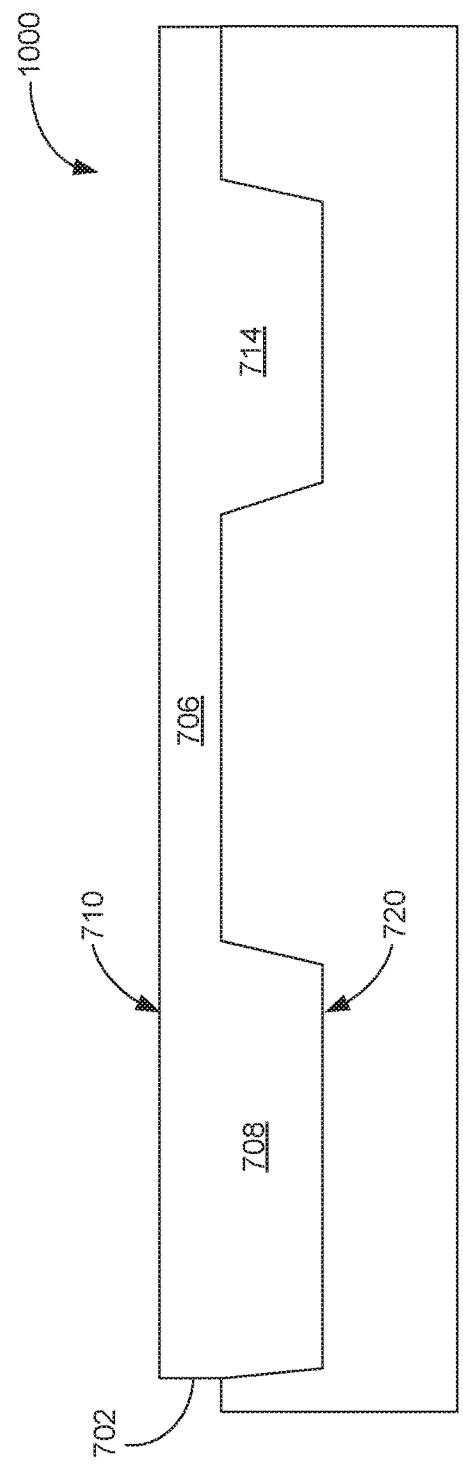

FIGS. 10A and 10B illustrate an example process 1000 of controlling thicknesses of flexible substrate 702 corresponding to a first device region 706 and a device peripheral region 708 of the flexible substrate in accordance with some implementations. Referring to FIG. 10A, rigid carrier 704 is recessed at one or more first areas 1002 on its top surface. Referring to FIG. 10B, a layer of substrate material is coated (and optionally patterned) on the recessed rigid carrier 704 to form flexible substrate 702 including one or more of device peripheral region 708, first device region 706 and second device region 714. In some embodiments, the layer of substrate material is prepared by spin coating, slot-die coating or slit coating. Rigid carrier 704 covered with the substrate material is optionally planarized on its top surface 710.

In some situations, flexible substrate 702 includes one or more of strong and weak or normal adhesion regions 802-806 on its bottom substrate 720. The top surface of the recessed rigid carrier 704 includes one or more surface areas corresponding to one or more of strong, weak or normal adhesion regions 802-806. Each of the one or more surface areas of rigid carrier 704 corresponding to one of the adhesion regions 802-806 is optionally coated with an adhesion control material, or treated using a physical or chemical process. It is noted that in some embodiments, any of strong, weak or normal adhesion regions 802-806 could simply come into contact with the top surface of rigid carrier 704 directly and without using adhesion control material or surface treatment.

Figure 11:
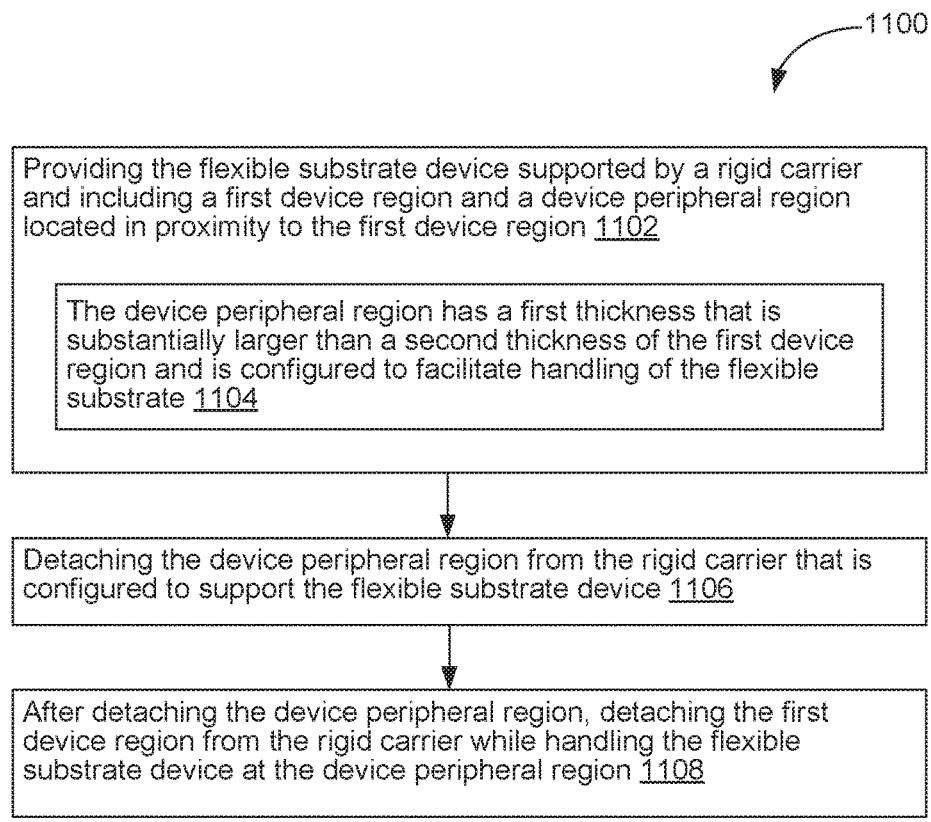
FIG. 11 is a flowchart of an example method of forming a flexible substrate device having two or more distinct thicknesses corresponding to a device region and a device peripheral region in accordance with some implementations.

FIG. 11 is a flowchart of an example method 1100 of forming a flexible substrate device having two or more distinct thicknesses corresponding to a device region 706 and a device peripheral region 708 in accordance with some implementations. Method 1100 provides (1102) a flexible substrate device, and the flexible substrate device is supported by a rigid carrier 704, and includes a first device region 706 and a device peripheral region 708 located in proximity to first device region 706. Device peripheral region 708 has (1104) a first thickness that is substantially larger than a second thickness of first device region 706, and is configured to facilitate handling of flexible substrate 702. More details on processes to provide the flexible substrate device are explained above with reference to FIGS. 9, 10A and 10B.

Device peripheral region 708 is detached (1106) from rigid carrier 704 that is configured to support the flexible substrate device. After device peripheral region 708 is detached, first device region 706 is detached (1108) from rigid carrier 704 while handling flexible substrate device 702 at device peripheral region 708.

Referring to FIGS. 2-11, a flexible substrate could include a TFT array formed on a device region, and a display panel device disposed on top of the TFT array. Attachment of the flexible substrate to a rigid carrier is merely temporary, because the flexible substrate is released from the rigid carrier when the TFT array and/or display panel device have been formed and integrated on the flexible substrate. A certain degree of bonding strength between the flexible substrate and the rigid carrier is necessary to prevent unwanted detachment during the course of forming the TFT array and/or the display panel device. Specifically, in some situations, the bonding strength needs to be sufficiently high for the purposes of protecting the flexible substrate against damage that could be caused by mechanical stress associated with the high thermal budget of the corresponding TFT manufacturing process. Detachment/debonding of the flexible substrate and the rigid carrier is realized by different methods in existing flexible substrate technologies. However, many of these detachment methods used in existing flexible substrate technologies involve application of localized detachment force, which could easily cause damage to the flexible substrate, the TFT array or the display panel device. Therefore, the adhesion strength has to be configured to provide strong adhesion during the course of forming the TFT array and/or the display panel device, while still allowing easy detachment of the flexible substrate without causing damage to the TFT array and the display panel device.

In accordance with some embodiments of the application, one or two debonding layers and/or one or more adhesion control layers are integrated at part of an interface between a flexible substrate and a rigid carrier. More specifically, a flexible substrate device includes a flexible substrate and a plurality of electronic devices formed on the top surface of the flexible substrate. The flexible substrate is made of a polymeric material and includes a top surface and a bottom surface that is opposite to the top surface. The bottom surface of the flexible substrate further includes a debonding region and one or more edge regions. The one or more edge regions are located in proximity to one or more edges of the flexible substrate and configured to adhere to a rigid carrier via the polymeric material. The debonding region is covered with a debonding layer and configured to adhere to the rigid carrier via at least the debonding layer. The polymeric material of the edge regions and the debonding layer of the debonding region together provide a desirable adhesion strength at the interface between the flexible substrate and the rigid carrier, and this arrangement provides strong adhesion during the course of forming the plurality of electronic devices, while allowing easy detachment of the flexible substrate without causing damage to the electronic devices formed on the flexible substrate.

FIG. 12A is an example flexible substrate device 1200 including a flexible substrate 1202 that adheres to a rigid carrier 1204 via at least a metallic debonding layer 1206, and FIG. 12B is an example flexible substrate device 1250 in which its flexible substrate 1202 has been detached from rigid carrier 1204 in accordance with some implementations. Flexible substrate 1202 is made of a polymeric material. In some embodiments, the polymeric material includes one or more of poly(methy methacrylate) (PMMA), poly(styrene), poly(vinyl phenol), silsesquioxane (glass resin), benzocyclobutene (BCB), polyimide, polynorbornene, polyamide, polyethersulfone, polyetherimide, polycarbonate, polyethelene naphthalate, polyester, acrylic polymer, and nylon. Rigid carrier 1204 is optionally made of glass, silicon or quartz, and the polymeric material is configured to adhere to glass rigid carrier 1202 with substantially strong adhesion strength.

Flexible substrate 1202 includes a top surface 1210 and a bottom surface 1220 that is opposite to the top surface. Bottom surface 1220 of flexible substrate 1202 further includes a debonding region 1206 and one or more edge regions 1208. The one or more edge regions 1208 are located in proximity to one or more edges of flexible substrate 1202 and configured to adhere to rigid carrier 1204 via the polymeric material. Debonding region 1206 is covered with a debonding layer 1212 that is made of metallic material, and configured to adhere to rigid carrier 1204 via at least the metallic debonding layer 1212. In some embodiments, the metallic material of debonding layer 1212 is one of nickel (Ni), tungsten (W), aluminum (Al), copper (Cu), silver (Ag) and an alloy thereof. The metallic debonding layer 1212 is deposited by physical vapor deposition (PVD) (e.g., evaporation and sputtering) or electroplating.

In some embodiments, debonding region 1206 further includes a first adhesion control layer 1214 coupled between the metallic debonding layer 1212 and the polymeric material of flexible substrate 1202. First adhesion control layer 1214 is configured to improve adhesion control between metallic debonding layer 1212 and bottom surface 1220 of flexible substrate 1202. Examples of first adhesion control layer 1214 include a dielectric layer (e.g., silicon oxide, nitride or oxynitride, aluminum oxide), a metal oxide layer, a self assembled layer, an organic silane compound, an adhesion promoter (e.g., hexamethyldisilazane (HMDS)), a metal layer (e.g., titanium (Ti)) and a combination thereof.

In some embodiments, thin film transistors are formed on top surface 1210 of flexible substrate 1202 while flexible substrate 1202 is supported by rigid carrier 1204. Display panel devices that are driven by the TFT arrays or additional electronic components 1216 that drive TFT arrays could also be disposed on top surface 1210 of flexible substrate 1202, and electrically coupled to the TFTs formed on flexible substrate 1202.

When first adhesion control layer 1214 controls adhesion of metallic debonding layer 1212 to bottom surface 1220 of flexible substrate 1202, metallic debonding layer 1212 becomes part of flexible substrate 1202 when flexible substrate 1202 is released from rigid carrier 1204. Alternatively, in some embodiments not shown in FIGS. 12A and 12B, first adhesion control layer 1214 is configured to reduce the adhesion strength between metallic debonding layer 1212 and bottom surface 1220 of flexible substrate 1202. Then, metallic debonding layer 1212 could be peeled off flexible substrate 1202 and left on the top surface of rigid carrier 1204 when flexible substrate 1202 is released from rigid carrier 1204.

It is noted that in some implementations not shown in FIGS. 12A and 12B, bottom surface 1220 of flexible substrate 1202 further includes a debonding region 1206 but does not include one or more edge regions 1208. Debonding region 1206 is covered with a debonding layer 1212 that is made of metallic material, and configured to adhere to rigid carrier 1204 via at least the metallic debonding layer 1212. Stated another way, bottom surface 1220 of flexible substrate 1202 is covered with a metallic debonding layer, and comes into contact with rigid carrier 1203 via the metallic debonding layer. Further, in some implementations, debonding region 1206 further includes a first adhesion control layer 1214 coupled between the metallic debonding layer 1212 and the polymeric material of flexible substrate 1202. First adhesion control layer 1214 is configured to improve adhesion control between metallic debonding layer 1212 and bottom surface 1220 of flexible substrate 1202.

Figure 13B:
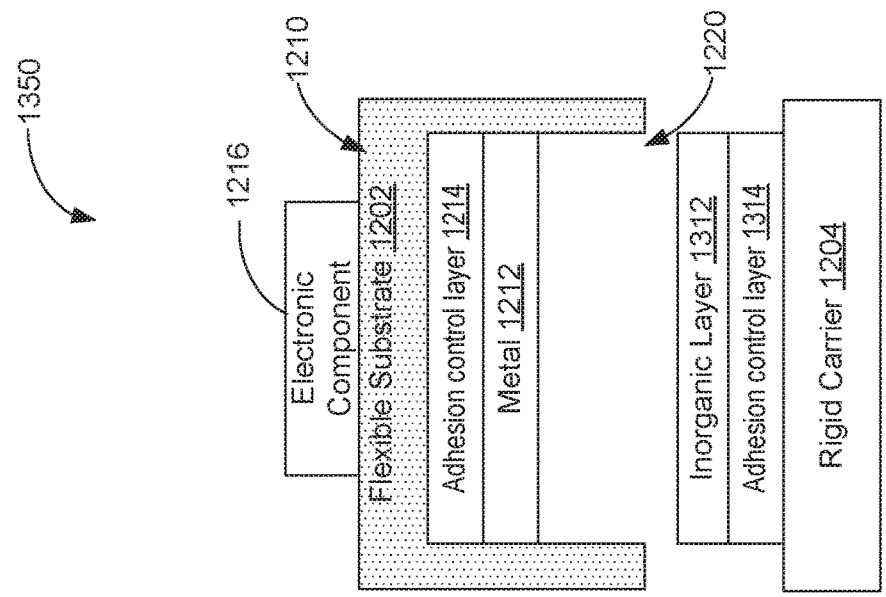
FIG. 13B is another example flexible substrate device in which its flexible substrate has been detached from a rigid carrier in accordance with some implementations.
Figure 13A:
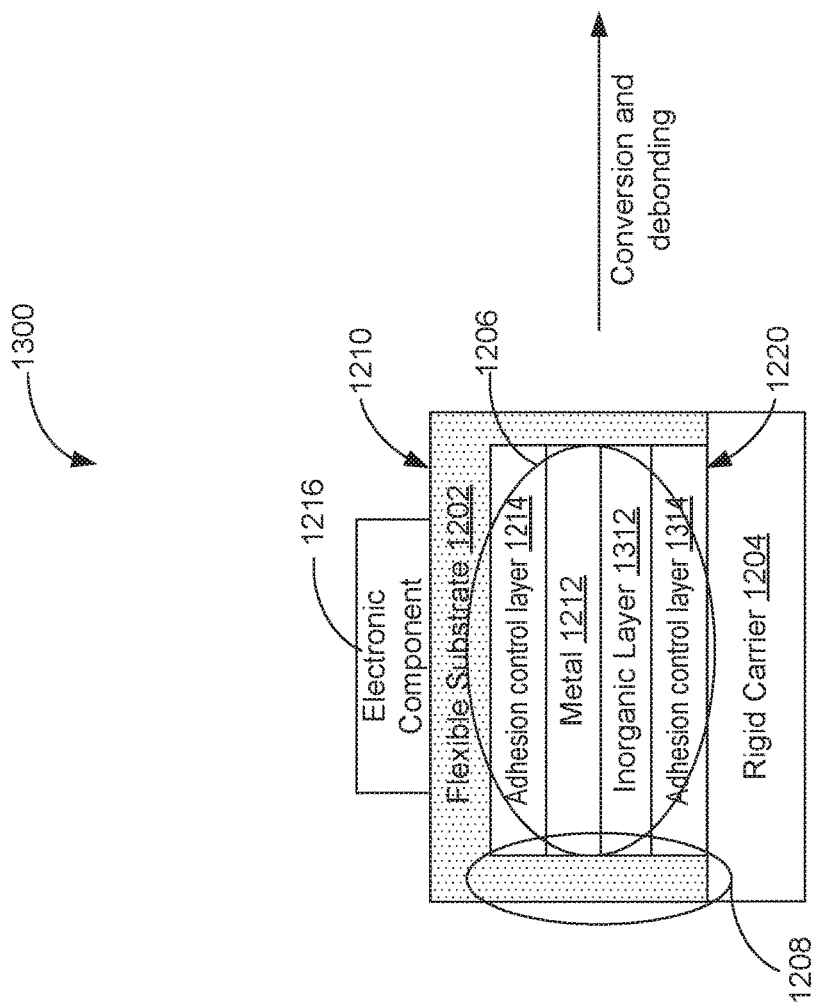
FIG. 13A is an example flexible substrate device including a flexible substrate that adheres to a rigid carrier via at least two debonding layers.

FIG. 13A is an example flexible substrate device 1300 including a flexible substrate 1202 that adheres to a rigid carrier 1204 via at least two debonding layers, and FIG. 13B is another example flexible substrate device 1350 in which its flexible substrate 1202 has been detached from a rigid carrier 1204 in accordance with some implementations. Debonding region 1206 is covered with a debonding layer 1212 that is made of metallic material, and configured to adhere to rigid carrier 1204 via at least the metallic debonding layer 1212. The debonding layer 1212 includes a first debonding layer. A debonding area of rigid carrier 1204 is associated with debonding region 1206 of flexible substrate 1202, and covered with a second debonding layer 1312 made of inorganic material. As such, debonding region 1206 is configured to adhere to rigid carrier 1204 via a debonding stack including first debonding layer 1212 and second debonding layer 1312.

In some embodiments, the inorganic material of second debonding layer 1312 is one of spin-on-glass, silicon oxynitride, silicon oxide, spin-on-dielectric and silicon nitride. Second debonding layer 1312 could be prepared by plasma-enhanced CVD (PECVD) or sputtering or spin-coating or slit coating.

In some embodiments, the debonding area of rigid carrier 1204 further includes a second adhesion control layer 1314 coupled between the debonding layer 1312 and the body of rigid carrier 1204. Second adhesion control layer 1314 is configured to enhance adhesion strength between second debonding layer 1312 and the body of rigid carrier 1204. Examples of second adhesion control layer 1314 include a dielectric layer (e.g., silicon oxide, nitride or ox oxynitride, aluminum oxide), a metal oxide layer, a self assembled layer, a silane compound, an adhesion promoter (e.g., hexamethyldisilazane (HMDS)), a metal layer (e.g., titanium (Ti)) and a combination thereof.

First adhesion control layer 1214 enhances adhesion of the metallic debonding layer 1212 to bottom surface 1220 of flexible substrate 1202, and second adhesion control layer 1314 enhances adhesion of debonding layer 1312 to a top surface of rigid substrate 1204. Also, it is noted that first adhesion control layer 1214 and second adhesion control layer 1314 are not necessary. The metallic debonding layer 1212 and first adhesion control layer 1214 (if used) stay with and become part of flexible substrate 1202 when flexible substrate 1202 is released from rigid carrier 1204. The debonding layer 1312 and second adhesion control layer 1314 (if used) remain with rigid carrier 1204 when flexible substrate 1202 is released from rigid carrier 1204.

It is also noted that in some implementations not shown in FIGS. 13A and 13B, bottom surface 1220 of flexible substrate 1202 further includes a debonding region 1206 but does not include one or more edge regions 1208. Debonding region 1206 is covered with a debonding layer 1212 that is made of metallic material, and configured to adhere to rigid carrier 1204 via at least the metallic debonding layer 1212 and another inorganic debonding layer 1312. Stated another way, bottom surface 1220 of flexible substrate 1202 is covered with a metallic debonding layer, and comes into contact with rigid carrier 1204 via the metallic debonding layer and another inorganic debonding layer 1312 coated on the top surface of rigid carrier 1204. Similarly, in some implementations, first adhesion control layer 1214 is applied to enhance adhesion of the metallic debonding layer 1212 to bottom surface 1220 of flexible substrate 1202, and second adhesion control layer 1314 enhances adhesion of debonding layer 1312 to the top surface of rigid substrate 1204.

Figure 14B:
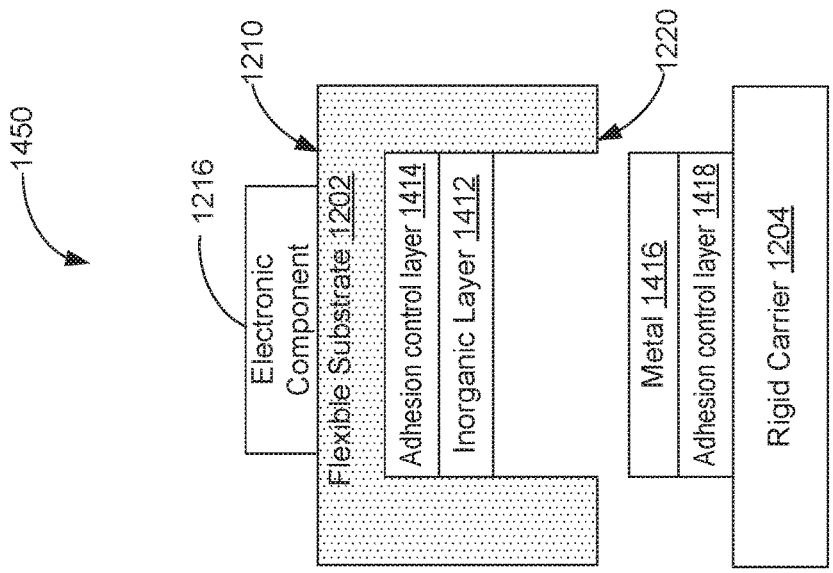
FIG. 14B is another example flexible substrate device in which its flexible substrate has been detached from a rigid carrier in accordance with some implementations.
Figure 14A:
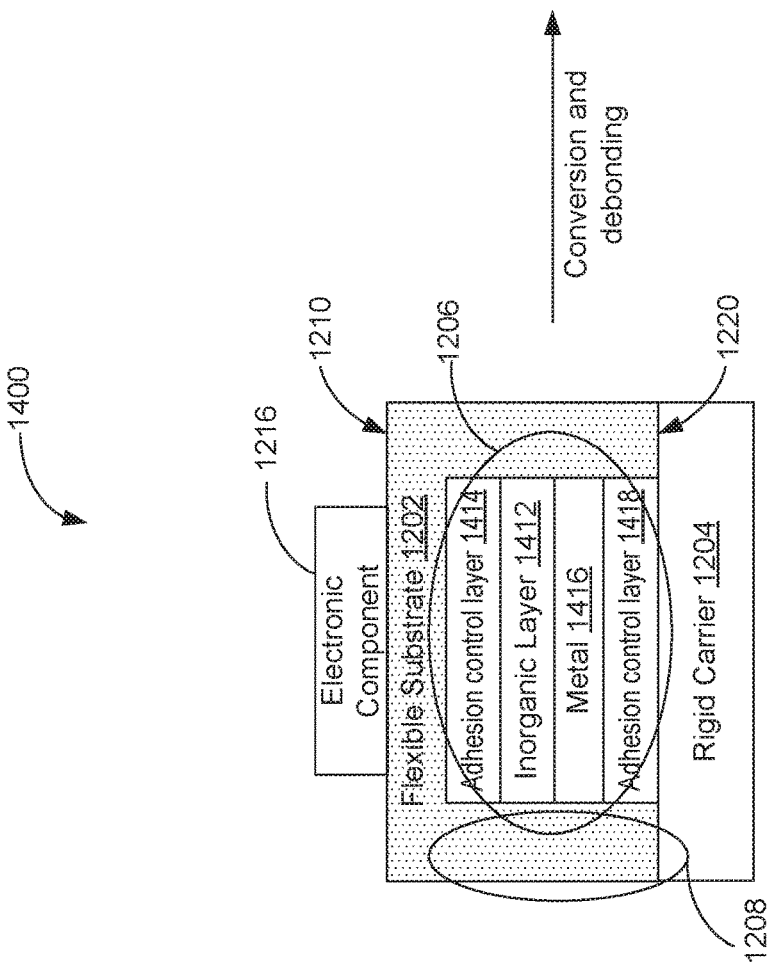
FIG. 14A is another example flexible substrate device including a flexible substrate that adheres to a rigid carrier via at least two debonding layers.

FIG. 14A is another example flexible substrate device 1400 including a flexible substrate 1202 that adheres to a rigid carrier 1204 via at least two debonding layers, and FIG. 14B is another example flexible substrate device 1450 in which its flexible substrate 1202 has been detached from a rigid carrier 1204 in accordance with some implementations. Debonding region 1206 is covered with a debonding layer 1412 that includes a first debonding layer made of inorganic material. A first adhesion control layer 1414 is optionally disposed between debonding layer 1412 and the polymeric material of flexible substrate 1202 to enhance adhesion strength therebetween. A debonding area of rigid carrier 1204 is associated with debonding region 1206 of flexible substrate 1204, and covered with a second debonding layer 1416 that is made of metallic material. In some embodiments, the inorganic material of first debonding layer 1412 is one of spin-on-glass, silicon oxynitride, silicon oxide, spin-on-dielectric and silicon nitride, while metallic material of second debonding layer 1416 is one of nickel (Ni), tungsten (W), aluminum (Al), copper (Cu), silver (Ag) and an alloy thereof. Optionally, metallic debonding layer 1416 is transparent. The metallic debonding layer 1412 is prepared by physical vapor deposition (PVD) (e.g., evaporation and sputtering) or electroplating.

In some embodiments, the debonding area of rigid carrier 1204 further includes a second adhesion control layer 1418 coupled between metallic debonding layer 1416 and the body of rigid carrier 1204. Second adhesion control layer 1418 is configured to enhance adhesion strength between second debonding layer 1416 and the body of rigid carrier 1204. Examples of second adhesion control layer 1418 include a dielectric layer (e.g., silicon oxide, nitride or ox oxynitride, aluminum oxide), a metal oxide layer, a self assembled layer, a silane compound, an adhesion promoter (e.g., hexamethyldisilazane (HMDS)), a metal layer (e.g., titanium (Ti)) and a combination thereof.

First adhesion control layer 1414 enhances adhesion of debonding layer 1416 to bottom surface 1220 of flexible substrate 1202, and second adhesion control layer 1418 enhances adhesion of the metallic debonding layer 1416 to a top surface of rigid substrate 1204. The debonding layer 1412 and first adhesion control layer 1414 (if used) stay with and become part of flexible substrate 1202 when flexible substrate 1202 is released from rigid carrier 1204. Metallic debonding layer 1416 and second adhesion control layer 1418 (if used) remain with rigid carrier 1204 when flexible substrate 1202 is released from rigid carrier 1204.

It is also noted that in some implementations not shown in FIGS. 14A and 14B, bottom surface 1220 of flexible substrate 1202 further includes a debonding region 1206 but does not include one or more edge regions 1208. Debonding region 1206 is covered with a debonding layer 1412 that is made of inorganic material, and configured to adhere to rigid carrier 1204 via at least the inorganic debonding layer 1412 and another metallic debonding layer 1416. Stated another way, bottom surface 1220 of flexible substrate 1202 is covered with an inorganic debonding layer 1412, and comes into contact with rigid carrier 1204 via the inorganic debonding layer 1412 and another metallic debonding layer 1416 coated on the top surface of rigid carrier 1204. Similarly, in some implementations, first adhesion control layer 1414 is applied to enhance adhesion of the inorganic debonding layer 1412 to bottom surface 1220 of flexible substrate 1202, and second adhesion control layer 1418 enhances adhesion of debonding layer 1416 to the top surface of rigid substrate 1204.

Figure 15D:
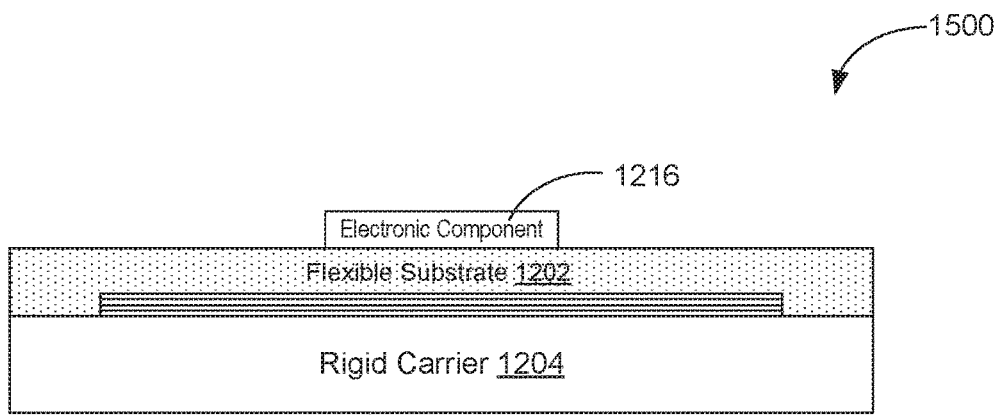

FIGS. 15A-15F is a process flow 1500 of preparing a flexible substrate (e.g., flexible substrate 1202) that adheres to a rigid carrier (e.g., rigid carrier 1204) via one or more debonding layers (e.g., debonding layers 1212, 1312, 1412 and 1416) during the course of manufacturing a TFT array on the flexible substrate in accordance with some implementations. In some embodiments, rigid carrier 1204 is made of glass, silicon or quartz. Referring to FIG. 15B, a debonding stack 1502 is deposited and optionally patterned on the top surface of rigid carrier 1204. The debonding stack includes one or more debonding layers 1504, e.g., a single metallic debonding layer 1212 as shown in FIGS. 12A and 12B, and a combination of a metallic debonding layer and a debonding layer made of inorganic material as shown in FIGS. 13A, 13B, 14A and 14B. Further, in some embodiments, the debonding stack further includes one or more adhesion control layers. A first adhesion control layer 1506 could be disposed on the top of the debonding stack to enhance adhesion strength between one or more debonding layers 1504 and polymeric material of the flexible substrate (which has not been formed in FIG. 15B). A second adhesion control layer 1508 could be disposed on the bottom of the debonding stack to enhance adhesion strength between one or more debonding layers 1504 and the top surface of the rigid carrier.

Referring to FIG. 15C, a layer of substrate material is coated on rigid carrier 1204 to form flexible substrate 1202. In some embodiments, the layer of substrate material is prepared by spin coating, slot-die coating or slit coating. Rigid carrier 1204 covered with the substrate material is optionally planarized on its top surface 1210. In various embodiments of the application, flexible substrate 1202 is made of polymeric material that includes one or more of poly(methy methacrylate) (PMMA), poly(styrene), poly(vinyl phenol), silsesquioxane (glass resin), benzocyclobutene (BCB), polyimide, polynorbornene, polyamide, polyethersulfone, polyetherimide, polycarbonate, polyethelene naphthalate, polyester, acrylic polymer, and nylon.

In some embodiments, thin film transistors are formed on top surface 1210 of flexible substrate 1202 while it is supported by rigid carrier 1204. Referring to FIG. 15D, display panel devices that are driven by the TFT arrays or additional electronic components 1216 that drive TFT arrays could also be disposed on top surface 1210 of flexible substrate 1202, and optionally, coupled to the TFTs formed on flexible substrate 1202 electrically. More details on the display panel devices are explained above with reference to FIG. 4.

Flexible substrate 1202 includes one or more edge regions are located in proximity to one or more edges of flexible substrate 1202, and configured to adhere to rigid carrier 1204 via the polymeric material of flexible substrate 1202. The one or more edge regions are detached from the rigid carrier that is configured to support the flexible substrate device. For example, the edge regions could be detached from the underlying rigid carrier using laser ablation. The flexible substrate is then handled by the detached edge regions during the subsequent substrate detachment process.

A debonding region is formed on bottom surface 1220 of flexible substrate 1202. The debonding region is associated with a debonding stack 1502. In some embodiments, when the detached edge regions are lifted up from flexible substrate 1202, the debonding region of flexible substrate 1202 could continue to be peeled off the rigid carrier with mechanical force.

Figure 15E:
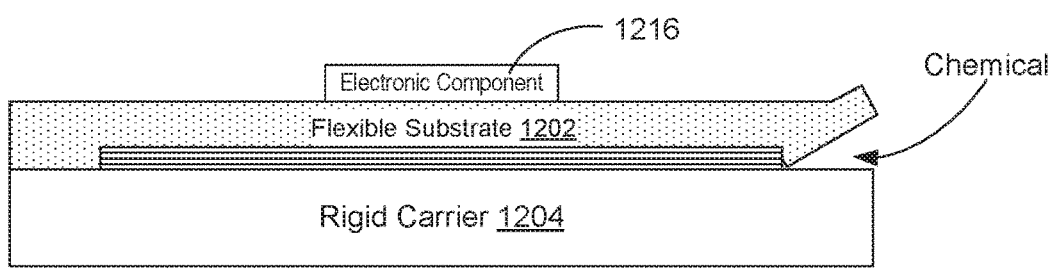
Figure 15F:
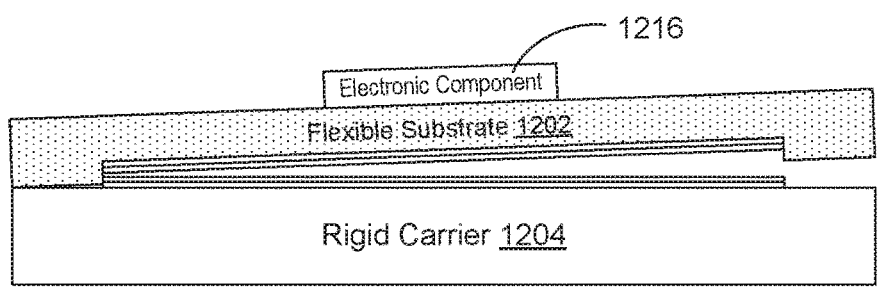

In some embodiments, referring to FIG. 15E, when the detached edge regions of flexible substrate 1202 are lifted up from rigid carrier 1204, a debonding chemical is injected under the detached edge regions. When a single debonding layer 1212 is applied as shown in FIGS. 12A and 12B, an interface between rigid carrier 1204 and debonding layer 1212 is gradually exposed to the debonding chemical during the course of detaching flexible substrate 1202. The debonding chemical is configured to reduce the adhesion between debonding layer 1212 of flexible substrate 1202 and the top surface of rigid carrier 1204, and allow flexible substrate 1202 to be gradually detached from rigid carrier 1204. After the debonding region is entirely detached from rigid carrier 1204, the single debonding layer 1212 stays with and becomes part of flexible substrate 1202. When more than one debonding layers are applied as shown in FIGS. 13A, 13B, 14A and 14B, an interface between two debonding layers (e.g., the interface between layers 1212 and 1312) is gradually exposed to the debonding chemical during the course of detaching flexible substrate 1202. The debonding chemical is configured to reduce the adhesion between the two adhesion layers, and allow flexible substrate 1202 to be gradually detached from rigid carrier 1204. One of the two debonding layer (e.g. first debonding layer 1212 or 1412) stays with and becomes part of flexible substrate 1202, and the other one of the two debonding layers (e.g., second debonding layer 1312 or 1416) stays with and becomes part of rigid carrier 1204. It is noted that each debonding layer is optionally coupled to the bottom surface of the flexible substrate or the top surface of the rigid carrier via a corresponding adhesion control layer.

In some implementations, the debonding chemical includes an organic solvent, such as ethanol, acetone, isopropanol and methanol. In some implementations, the debonding chemical is water.

Figure 16:
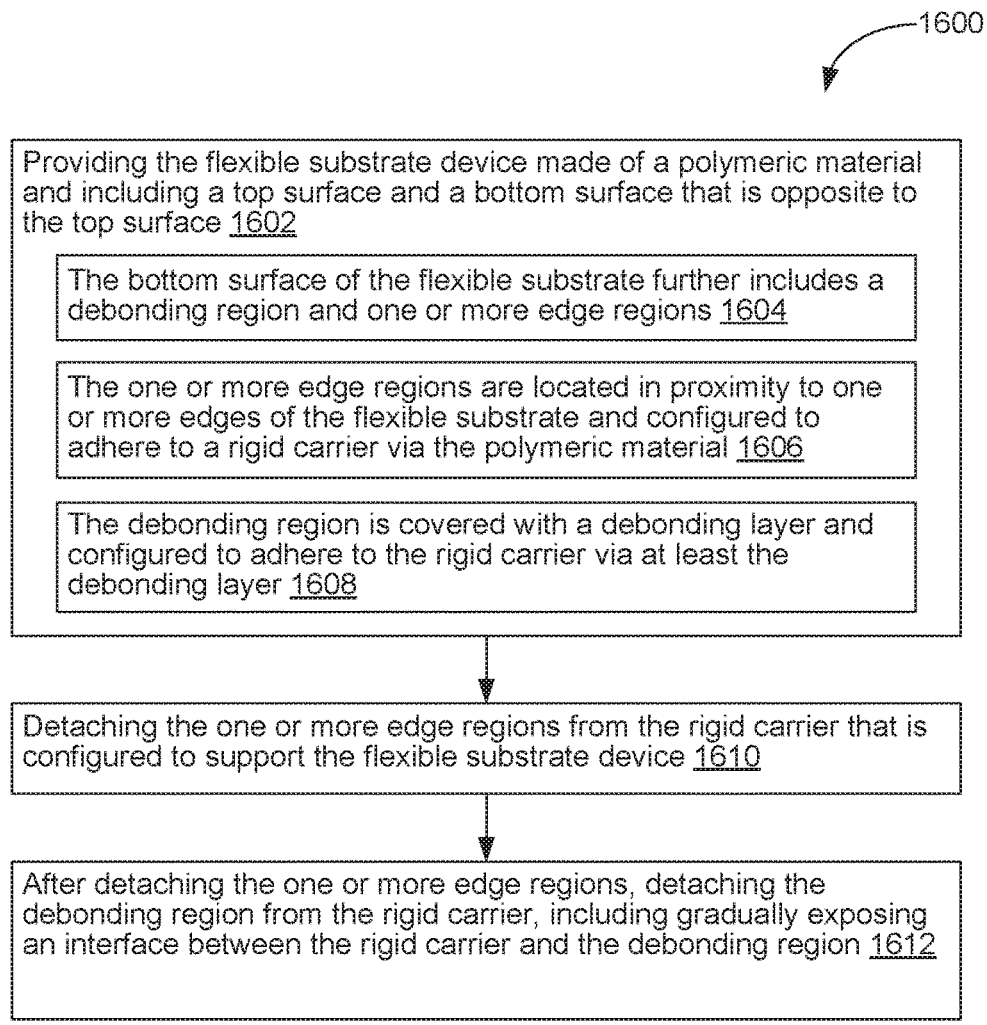
FIG. 16 is a flowchart of an example method of forming a flexible substrate device that is configured to adhere to a rigid carrier via at least one debonding layer in accordance with some implementations.

FIG. 16 is a flowchart of an example method 1600 of forming a flexible substrate device that is configured to adhere to a rigid carrier via at least one debonding layer in accordance with some implementations. Method 1600 provides (1602) the flexible substrate device (e.g., flexible substrate 1202 in FIGS. 12-15) made of a polymeric material. A flexible substrate includes a top surface and a bottom surface that is opposite to the top surface. The bottom surface of the flexible substrate further includes (1604) a debonding region and one or more edge regions. The one or more edge regions (1606) are located in proximity to one or more edges of the flexible substrate and configured to adhere to a rigid carrier via the polymeric material. The debonding region (1608) is covered with a debonding layer and configured to adhere to the rigid carrier via at least the debonding layer.

The one or more edge regions is detached (1610) from the rigid carrier that is configured to support the flexible substrate device. For example, the edge regions could be detached from the underlying rigid carrier using laser ablation. The flexible substrate is then handled by the detached edge regions during the subsequent substrate detachment process.

After the one or more edge regions are detached, the debonding region is detached (1612) from the rigid carrier, including gradually exposing an interface between the rigid carrier and the debonding region. During the course of detaching the flexible substrate, an interface between the rigid carrier and the debonding layer is gradually exposed. In some embodiments, a debonding chemical is gradually injected to the exposed interface between the rigid carrier and the debonding layer via the detached one or more edge regions. The debonding chemical is configured to reduce the adhesion between the debonding layer of the flexible substrate and the rigid carrier, and allow the flexible substrate to be gradually detached from the rigid carrier. In some embodiments, when the rigid carrier is also covered with a debonding layer at an area corresponding to the debonding region of the flexible substrate. The debonding chemical is gradually injected to the exposed interface between the respective debonding layers of the flexible substrate and the rigid carrier via the detached one or more edge regions.

Figure 17:
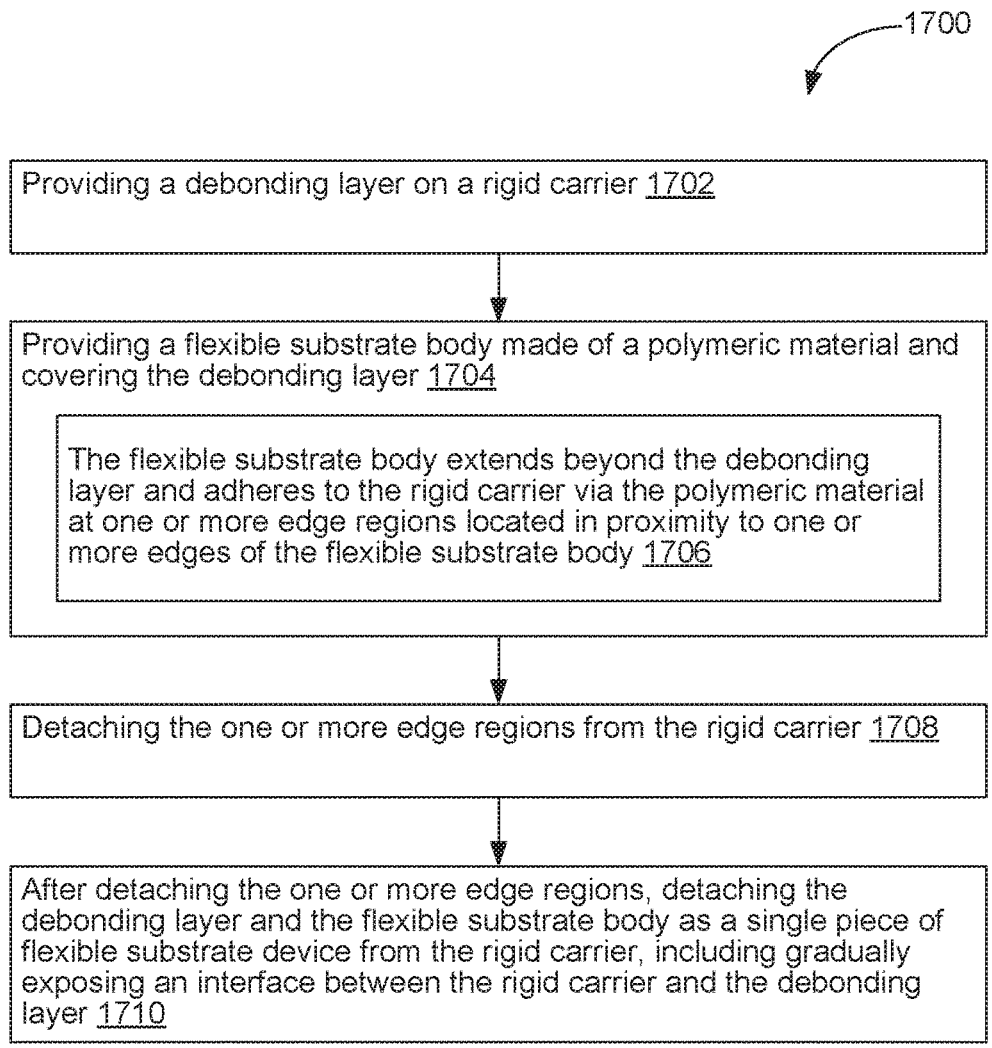
FIG. 17 is a flowchart of another example method of forming a flexible substrate device that is configured to adhere to a rigid carrier via at least one debonding layer in accordance with some implementations.

FIG. 17 is a flowchart of another example method 1700 of forming a flexible substrate device that is configured to adhere to a rigid carrier via at least one debonding layer in accordance with some implementations. A debonding layer is formed (1702) on the rigid carrier. Referring to FIGS. 12A and 12B, in some embodiments, debonding region 1206 is covered with a debonding layer 1212 that is made of metallic material, and configured to adhere to rigid carrier 1204 via at least the metallic debonding layer 1212. In some embodiments, the metallic material of debonding layer 1212 is one of nickel (Ni), tungsten (W), aluminum (Al), copper (Cu), silver (Ag) and an alloy thereof. The metallic debonding layer 1212 is deposited on the rigid carrier by physical vapor deposition (PVD) (e.g., e-beam evaporation and sputtering) or electroplating.

A flexible substrate body made of a polymeric material is then formed (1704) to cover the debonding layer. In some embodiments, the flexible substrate body is formed by one of direct lamination, spin coating, slot-die coating and slit coating. Alternatively, in some embodiments, the flexible substrate body is formed by physical vapor deposition (PVD) or chemical vapor deposition (CVD). Rigid carrier 704 covered with the substrate material is optionally planarized on its top surface 710. The flexible substrate body extends (1706) beyond the debonding layer and adheres to the rigid carrier via the polymeric material at one or more edge regions located in proximity to one or more edges of the flexible substrate body. In some embodiments, TFT arrays are then formed on device regions of the flexible substrate. Display panel devices that are driven by the TFT arrays are disposed on top of TFT arrays and electrically coupled thereto.

The one or more edge regions are detached (1708) from the rigid carrier. After the one or more edge regions are detached, the debonding layer and the flexible substrate body are detached (1710) as a single piece of flexible substrate device from the rigid carrier. In some embodiments, a debonding chemical is gradually injected to an exposed interface between the rigid carrier and the flexible substrate via the detached one or more edge regions. Thus, after the release, the debonding layer is physically coupled to the flexible substrate body of the flexible substrate. More details on detaching the flexible substrate are explained above with reference to FIGS. 16 and 17.

In some embodiments, a first adhesion control layer is deposited and patterned directly on the debonding layer. The flexible substrate body is then formed to cover both the first adhesion layer and the debonding layer.

Further, in some embodiments, the debonding layer includes a first debonding layer. A second debonding layer is deposited on the rigid carrier before the first debonding layer is deposited. Referring to FIGS. 13A and 13B, the first and second debonding layers are made of metallic material and inorganic material, respectively. Referring to FIGS. 14A and 14B, the first and second debonding layers are made of inorganic material and metallic material, respectively. Moreover, a first adhesion control layer could be deposited and patterned directly on the first debonding layer. A second adhesion control layer could be deposited and patterned directly on the rigid carrier before the second debonding layer is deposited on the rigid carrier.

It should be understood that the flexible substrate devices described in this application are merely exemplary and are not intended to indicate that they are the only flexible substrate devices that can be implemented in this application. One of ordinary skill in the art would recognize various ways to form a flexible substrate device based on the flexible substrates as described herein. Additionally, it should be noted that details of the flexible substrate device described herein with respect to any of FIGS. 2-17 are applicable in an analogous manner to other flexible substrate devices described herein with respect to other figures of FIGS. 2-17. For brevity, these details are not repeated.

The foregoing description, for purpose of explanation, has been described with reference to specific implementations. However, the illustrative discussions above are not intended to be exhaustive or to limit the scope of the claims to the precise forms disclosed. Many modifications and variations are possible in view of the above teachings. The implementations were chosen in order to best explain the principles underlying the claims and their practical applications, to thereby enable others skilled in the art to best use the implementations with various modifications as are suited to the particular uses contemplated.

Reference has been made in detail to implementations, examples of which are illustrated in the accompanying drawings. In the detailed description, numerous specific details are set forth in order to provide a thorough understanding of the various described implementations. However, it will be apparent to one of ordinary skill in the art that the various described implementations may be practiced without these specific details. In other instances, well-known methods, procedures, components, mechanical structures, circuits, and networks have not been described in detail so as not to unnecessarily obscure aspects of the implementations.

It will also be understood that, although the terms first, second, etc. are, in some instances, used herein to describe various elements, these elements should not be limited by these terms. These terms are only used to distinguish one element from another. For example, a first fastener structure can be termed a second fastener structure, and, similarly, a second fastener structure can be termed a first fastener structure, without departing from the scope of the various described implementations. The first fastener structure and the second fastener structure are both fastener structures, but they are not the same fastener structure.

The terminology used in the description of the various described implementations herein is for the purpose of describing particular implementations only and is not intended to be limiting. As used in the description of the various described implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, components, structures and/or groups, but do not preclude the presence or addition of one or more other features, integers, steps, operations, elements, components, structures, and/or groups thereof.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

It is noted that the flexible substrate devices described herein are exemplary and are not intended to be limiting. For example, any dimensions, shapes, profiles, and/or materials described herein are exemplary and are not intended to be limiting. Drawings are not to scale. For brevity, features or characters described in association with some implementations may not necessarily be repeated or reiterated when describing other implementations. Even though it may not be explicitly described therein, a feature or characteristic described in association with some implementations may be used by other implementations.

What is claimed is:

1. A flexible substrate device, comprising:
   a flexible substrate including a top surface and a bottom surface that is opposite to the top surface; and
   a plurality of electronic devices formed on the top surface of the flexible substrate;
   wherein:
   the bottom surface further includes one or more strong adhesion regions and one or more normal adhesion regions that are distinct from the one or more strong adhesion regions;
   each of the one or more strong adhesion regions and the one or more normal adhesion regions is configured to attach to a rigid carrier with first adhesion strength or second adhesion strength, respectively;
   the first adhesion strength is substantially larger than the second adhesion strength;
   the one or more strong adhesion regions and the one or more normal adhesion regions are made from the same material of the flexible substrate; and
   the one or more strong adhesion regions and the one or more normal adhesion regions are exposed on the bottom surface of the flexible substrate, and the one or more strong adhesion regions form a grid enclosing the one or more normal adhesion regions.

2. The flexible substrate device of claim 1, wherein the one or more strong adhesion regions include a respective stripe disposed in proximity to each of a plurality of edges of the bottom surface.

3. The flexible substrate device of claim 1, wherein the flexible substrate is configured to be detached from the rigid carrier when both the strong and normal adhesion regions are separated from the rigid carrier.

4. The flexible substrate device of claim 1, wherein the one or more strong adhesion regions and the one or more normal adhesion regions are covered with two distinct materials to provide the first adhesion strength and the second adhesion strength, respectively.

5. The flexible substrate device of claim 1, wherein the rigid carrier includes one or more first surface areas to which the one or more strong adhesion regions are attached with the first adhesion strength, and one or more second surface areas to which the one or more normal adhesion regions are attached with the second adhesion strength, and wherein the first and second surface areas are configured to be treated differently to enable the first adhesion strength and the second adhesion strength.

6. The flexible substrate device of claim 1, wherein the one or more strong adhesion regions and the one or more normal adhesion regions of the flexible substrate are physically or chemically treated in different manners to enable the first adhesion strength and the second adhesion strength that are distinct from each other.

7. The flexible substrate device of claim 1, wherein the one or more strong adhesion regions are configured to be detached from the rigid carrier via laser ablation.

8. The flexible substrate device of claim 1, wherein the one or more normal adhesion regions are configured to be detached from the rigid carrier by being mechanically peeled off the rigid carrier.

9. The flexible substrate device of claim 1, wherein the plurality of electronic devices includes a plurality of pixel drive circuits formed from thin film transistors (TFT), and each pixel circuit is configured to drive a display pixel of a display device.

10. A flexible substrate device, comprising:
    a flexible substrate including a first device region, a second device region and a device peripheral region located in proximity to the first device region, wherein:
    the flexible substrate has a first non-planar side extending across the first and second device regions and the device peripheral region;
    the device peripheral region has a first thickness that is substantially larger than a second thickness of the first device region, and is configured to at least facilitate handling of the flexible substrate, the first and second thicknesses extending along directions that are perpendicular to the first non-planar side of the device peripheral region and the first device region, respectively; and
    the second device region has a thickness that is substantially equal to the first thickness of the device peripheral region, and is formed as an island substantially away from any edge of the flexible substrate; and
    a plurality of electronic devices, a first one of the plurality of electronic devices being formed on the first non-planar side of the first device region of the flexible substrate, a second one of the plurality of electronic devices being disposed on the first non-planar side of the second device region of the flexible substrate.

11. The flexible substrate device of claim 10, wherein the first thickness of the device peripheral region is within a range of 10-200 μm, and the second thickness of the first device region is within a range of 5-30 μm.

12. The flexible substrate device of claim 10, wherein the flexible substrate has a second side opposite to the first non-planar side, and in the device peripheral region, the second side includes a strong adhesion region and a weak adhesion region configured to adhere to a rigid carrier with two distinct adhesion strengths.

13. The flexible substrate device of claim 10, wherein the device peripheral region is configured to support an electronic circuit component disposed on the device peripheral region.

14. The flexible substrate device of claim 10, wherein the device peripheral region is configured to support electronic bonding to one or more electronic pads or leads of the flexible substrate device.

15. A flexible substrate device, comprising:
   a flexible substrate made of a polymeric material and including a top surface and a bottom surface that is opposite to the top surface, wherein:
      the bottom surface of the flexible substrate further includes a debonding region and one or more edge regions that are distinct from the debonding region;
      the debonding region and the one or more edge regions are made from a first material and a second material, respectively, the first and second materials being distinct and different from each other;
      the one or more edge regions are located in proximity to one or more edges of the flexible substrate and configured to directly contact and adhere to a rigid carrier via the second material and detach from the rigid carrier with the debonding region; and
      the debonding region is covered with a debonding layer and configured to adhere to the rigid carrier via at least the debonding layer; and
   a plurality of electronic devices formed on the top surface of the flexible substrate.

16. The flexible substrate device of claim 15, wherein the debonding region includes a first adhesion control layer coupled between the debonding layer and the polymeric material of the flexible substrate.

17. The flexible substrate device of claim 16, wherein the first adhesion control layer is one selected from the group consisting of a dielectric layer, a metal oxide layer, a self-assembled layer, an adhesion promoter, a metal layer and a combination thereof.

18. The flexible substrate device of claim 15, wherein the debonding layer is made of a metallic material configured to adhere to an inorganic material layer coated on the rigid carrier.

19. The flexible substrate device of claim 15, wherein the debonding layer is made of an inorganic material configured to adhere to a metallic layer coated on the rigid carrier.

20. The flexible substrate device of claim 15, wherein the one or more edge regions are configured to support an electronic circuit component disposed on the one or more edge regions.

* * * * *